(12) United States Patent
Nakajima et al.

(10) Patent No.: US 11,482,489 B2
(45) Date of Patent: Oct. 25, 2022

(54) SEMICONDUCTOR DEVICE AND METHOD OF MANUFACTURING THE SAME

(71) Applicant: KIOXIA CORPORATION, Tokyo (JP)

(72) Inventors: Shingo Nakajima, Yokkaichi (JP); Ryota Asada, Kuwana (JP); Hidenobu Nagashima, Yokkaichi (JP); Masayuki Akou, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 168 days.

(21) Appl. No.: 16/990,793

(22) Filed: Aug. 11, 2020

(65) Prior Publication Data

US 2020/0373237 A1 Nov. 26, 2020

Related U.S. Application Data

(62) Division of application No. 16/026,170, filed on Jul. 3, 2018, now Pat. No. 10,777,501.

(30) Foreign Application Priority Data

Mar. 16, 2018 (JP) .............................. JP2018-049280

(51) Int. Cl.
*H01L 23/522* (2006.01)
*H01L 23/532* (2006.01)
*H01L 23/535* (2006.01)
*H01L 27/11556* (2017.01)
*H01L 27/11582* (2017.01)

(52) U.S. Cl.
CPC ........ *H01L 23/5226* (2013.01); *H01L 23/535* (2013.01); *H01L 23/53295* (2013.01); *H01L 27/11556* (2013.01); *H01L 27/11582* (2013.01)

(58) Field of Classification Search
CPC .............. H01L 23/5226; H01L 23/535; H01L 27/11556; H01L 27/11582; H01L 23/53295

See application file for complete search history.

(56) References Cited

U.S. PATENT DOCUMENTS 9,917,100 B2 * 3/2018 Zhang ............... H01L 27/11519
9,960,181 B1 * 5/2018 Cui .................... H01L 29/40117
10,115,681 B1 10/2018 Ariyoshi et al.
(Continued)

FOREIGN PATENT DOCUMENTS

| JP | 2011-138945 | 7/2011 |
| TW | 201114021 A1 | 4/2011 |
| TW | 201203366 A1 | 1/2012 |

*Primary Examiner* — Peter Bradford
(74) *Attorney, Agent, or Firm* — Oblon, McClelland, Maier & Neustadt, L.L.P.

(57) ABSTRACT

According to one embodiment, a semiconductor device includes a substrate, an interconnect layer, a layer stack, and a first silicon nitride layer. The interconnect layer includes a transistor provided on the substrate and a first interconnect electrically coupled to the transistor and is provided above the transistor. The layer stack is provided above the interconnect layer and includes conductive layers stacked with an insulation layer interposed between two of conductive layers of each pair of conductive layers. The first silicon nitride layer is provided between the interconnect layer and the layer stack.

5 Claims, 34 Drawing Sheets

(56) References Cited

U.S. PATENT DOCUMENTS

| | | | |
|---|---|---|---|
| 10,304,852 B1* | 5/2019 | Cui | ................... H01L 27/11565 |
| 2010/0320526 A1 | 12/2010 | Kidoh et al. | |
| 2015/0129878 A1* | 5/2015 | Shin | ................. H01L 27/11526 |
| | | | 257/329 |
| 2016/0307917 A1 | 10/2016 | Yada et al. | |
| 2017/0236746 A1* | 8/2017 | Yu | ..................... H01L 21/76805 |
| | | | 257/314 |

\* cited by examiner

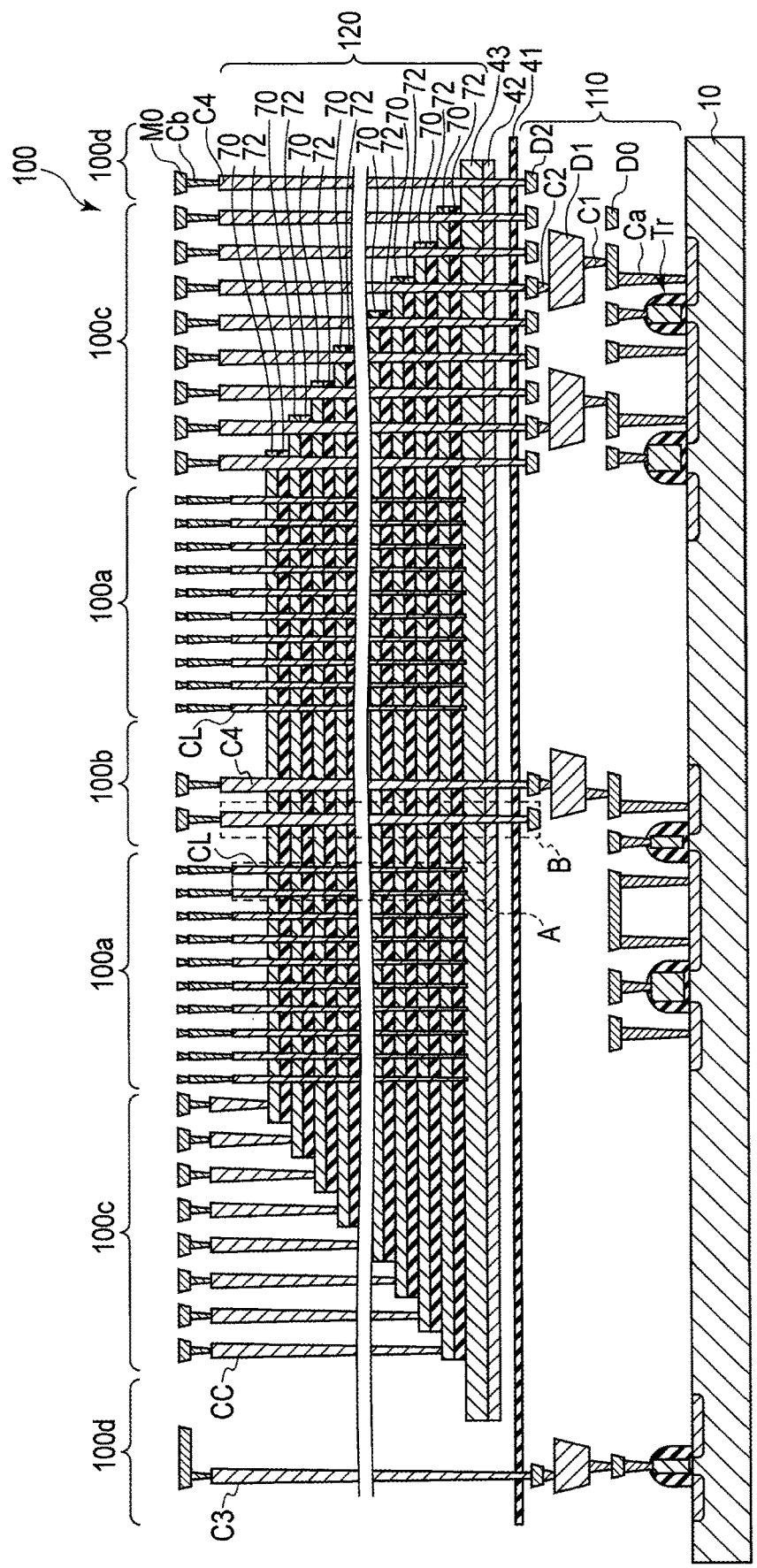
F I G. 2

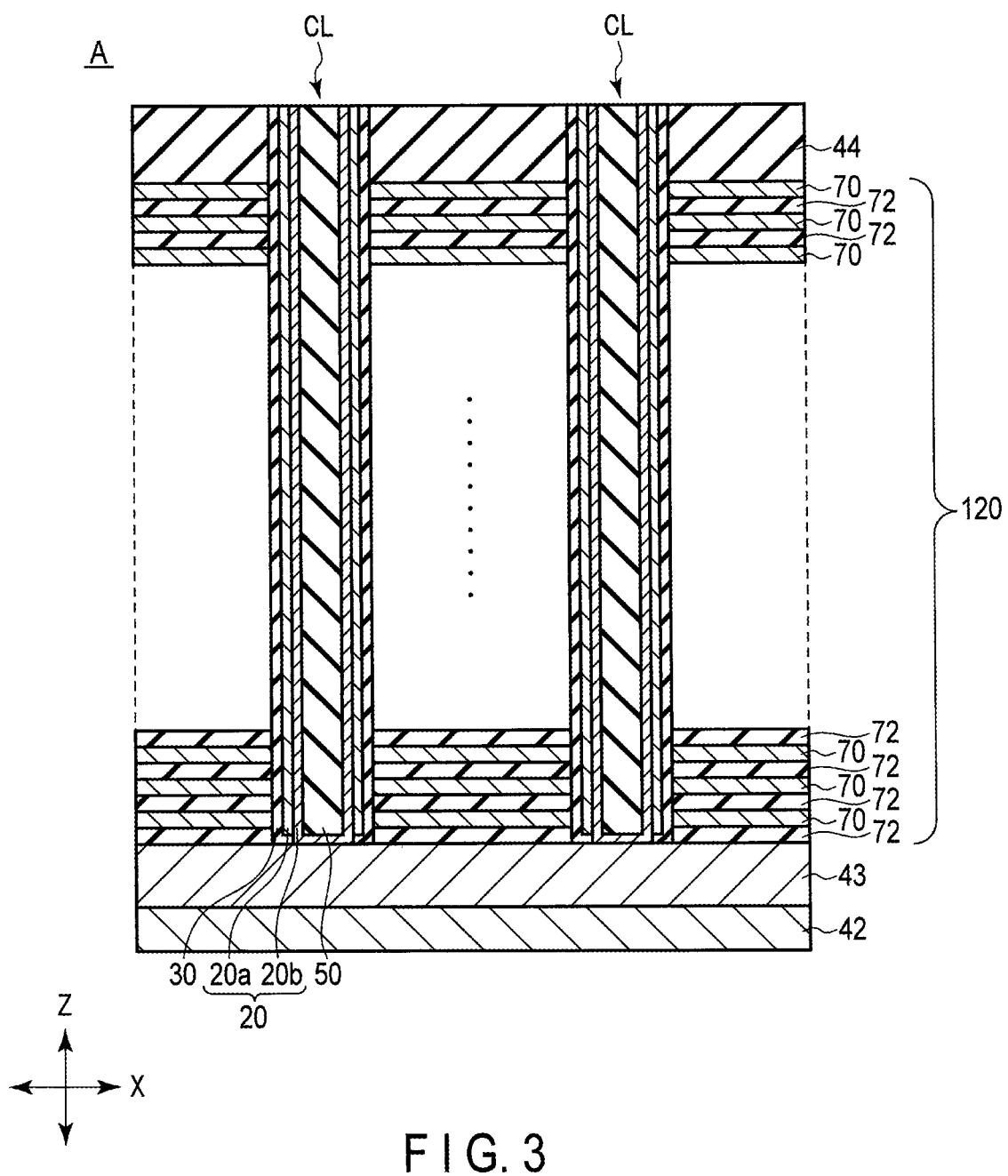
F I G. 3

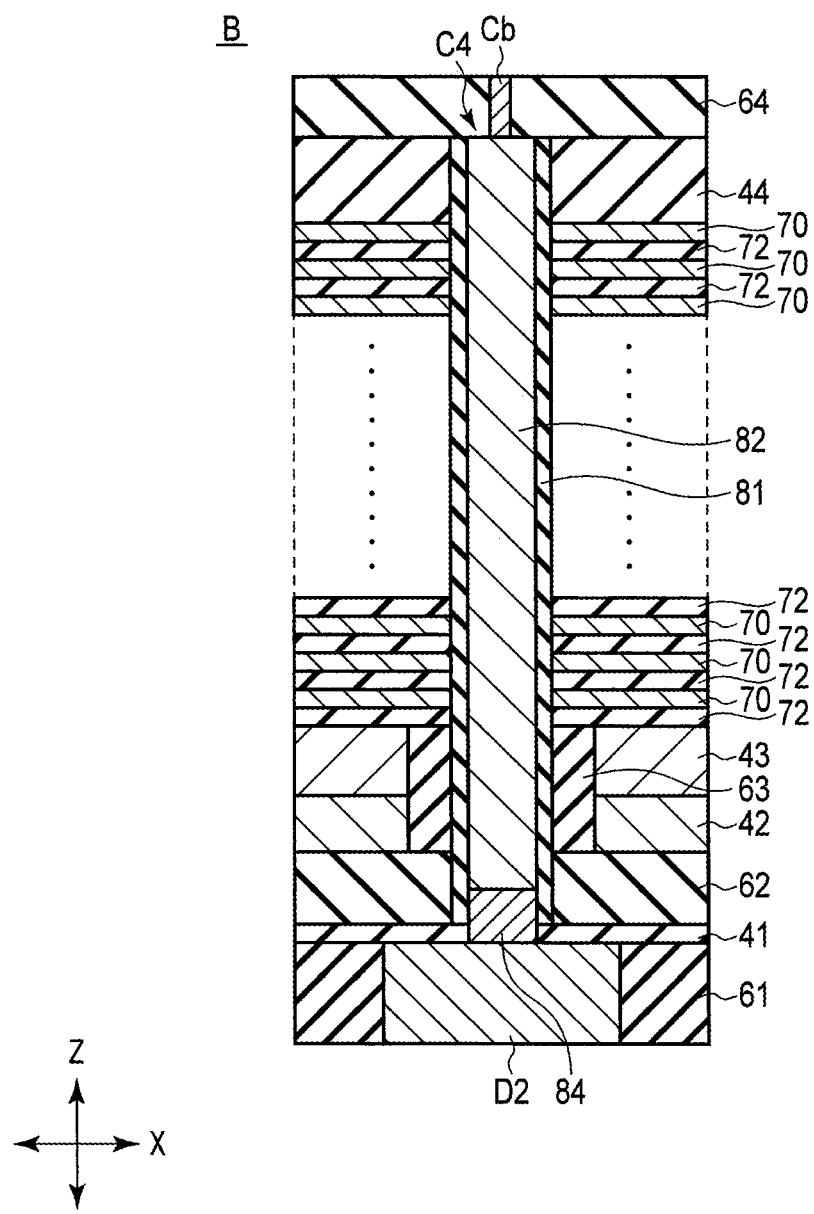
F I G. 15

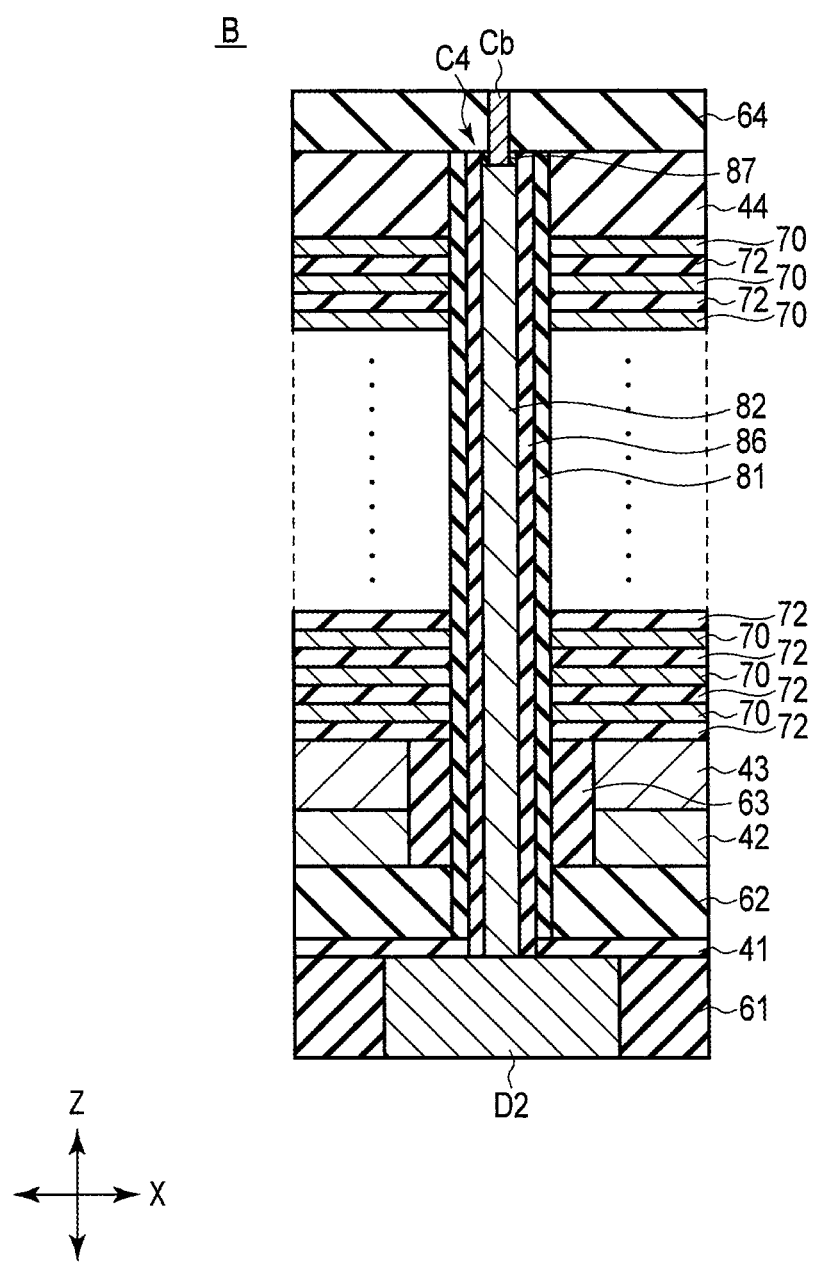
F I G. 17

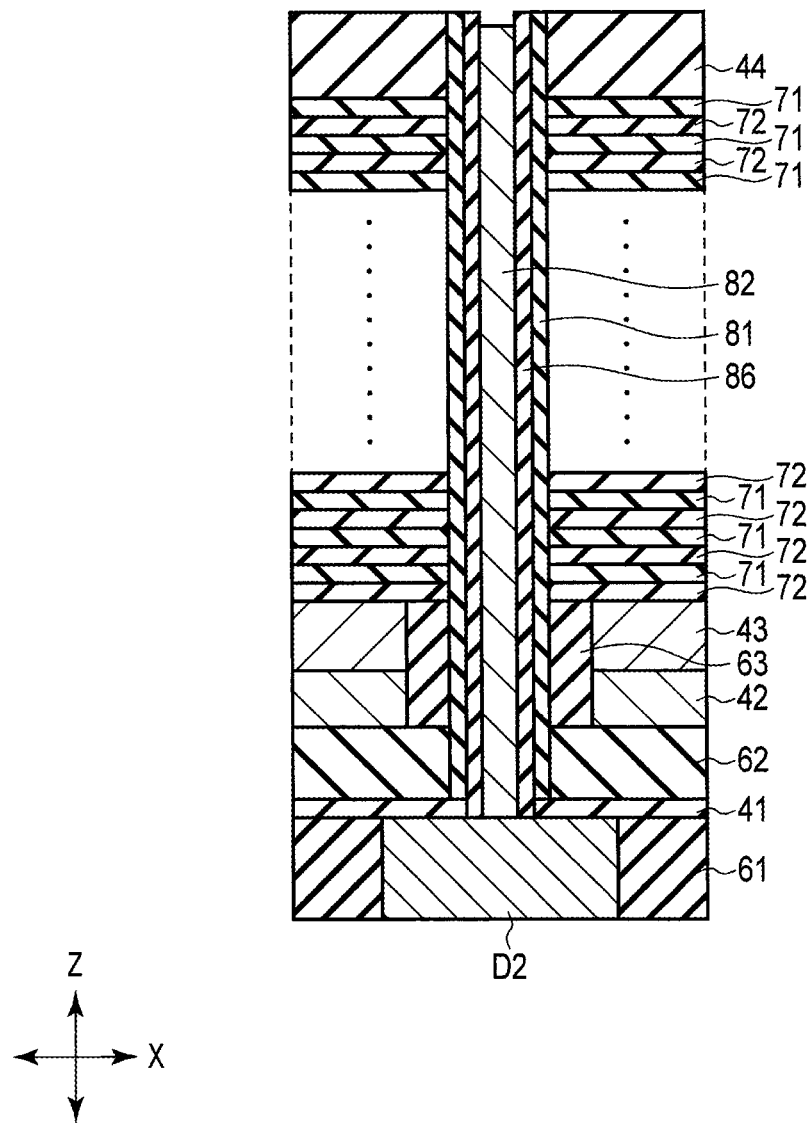
F I G. 20

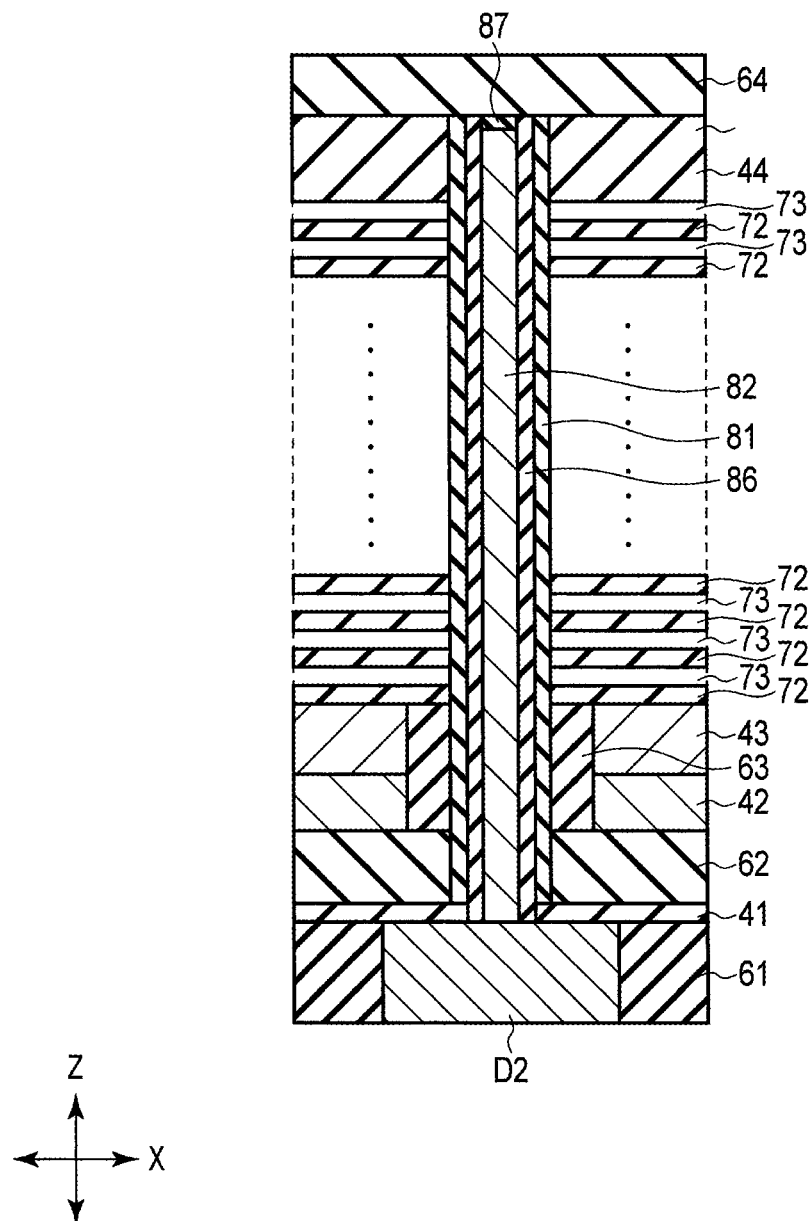
F I G. 22

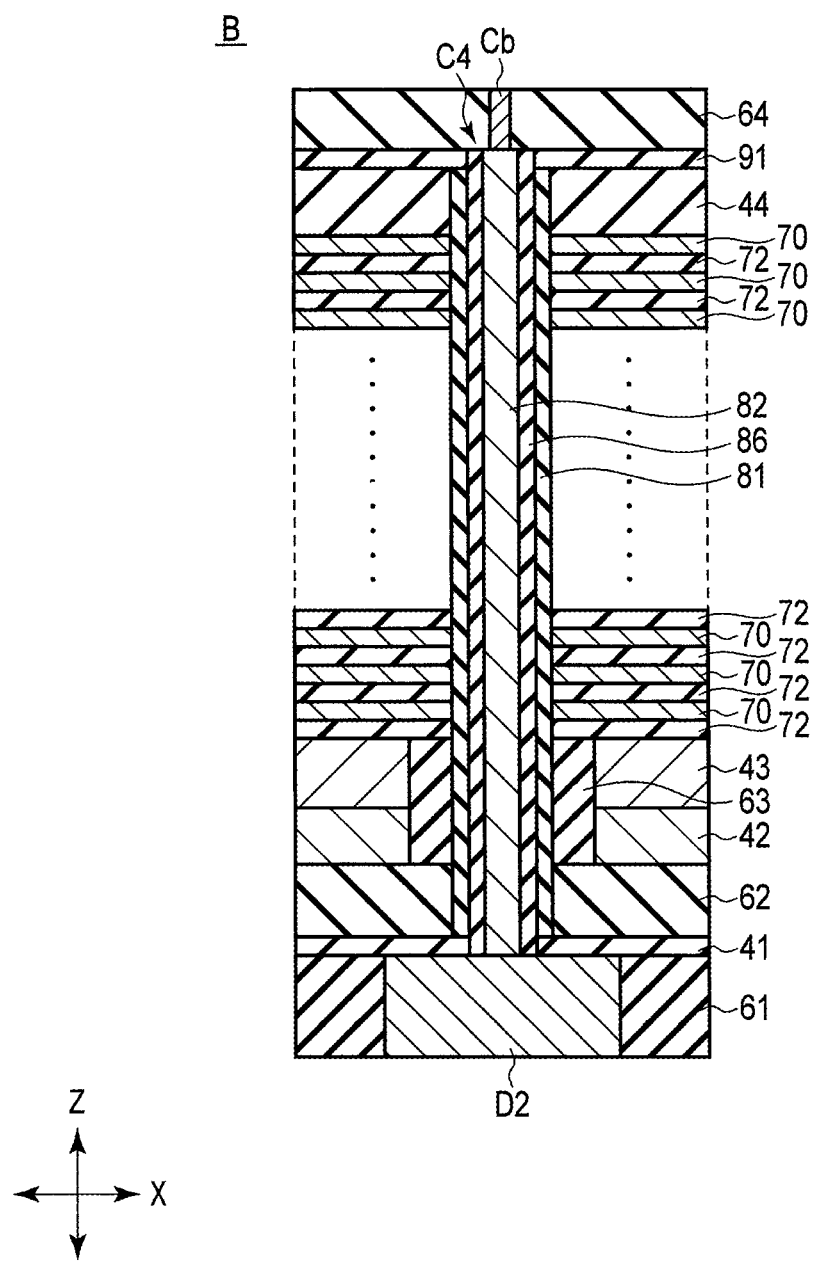
F I G. 24

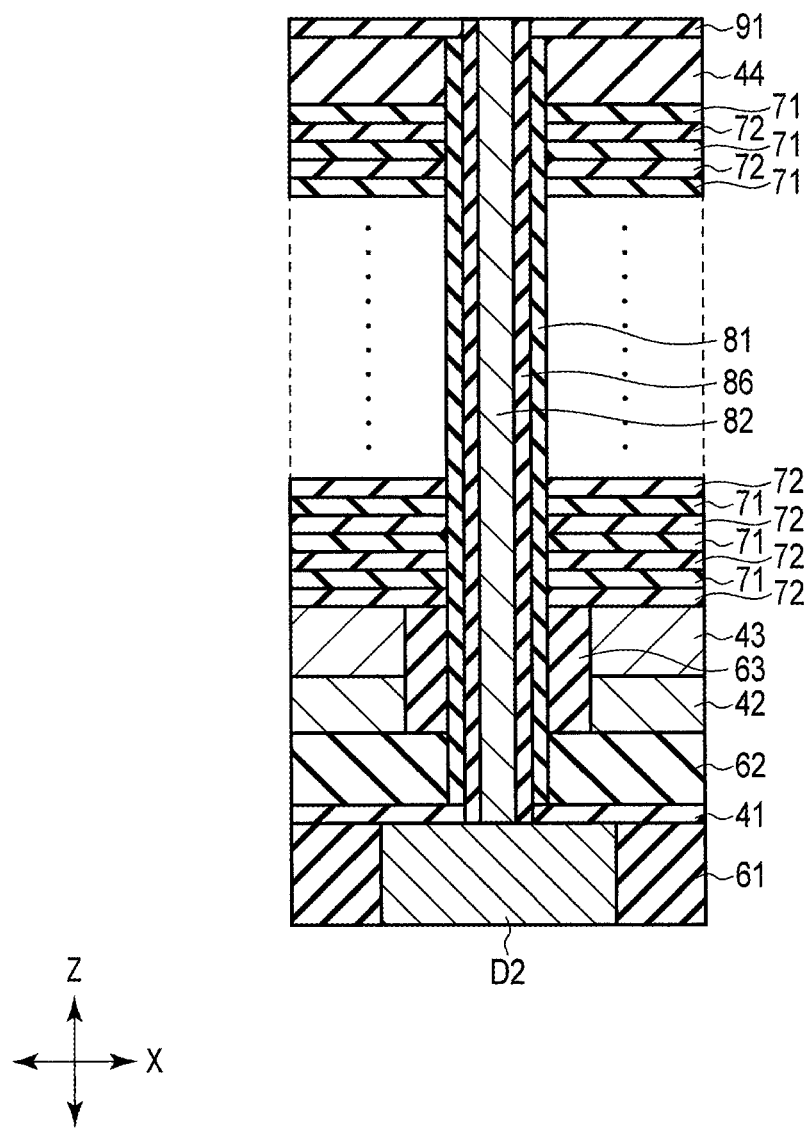
F I G. 25

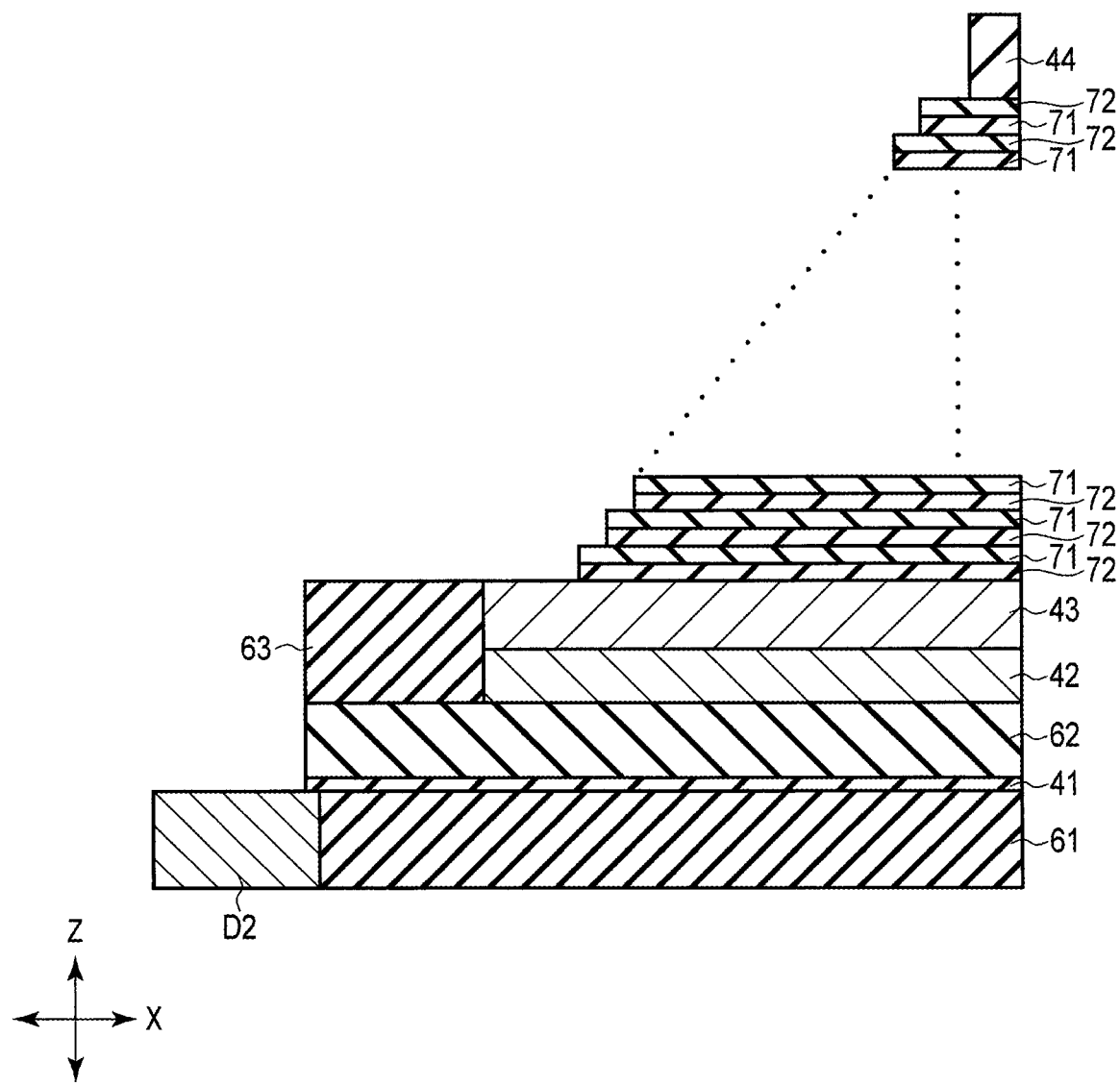
F I G. 33

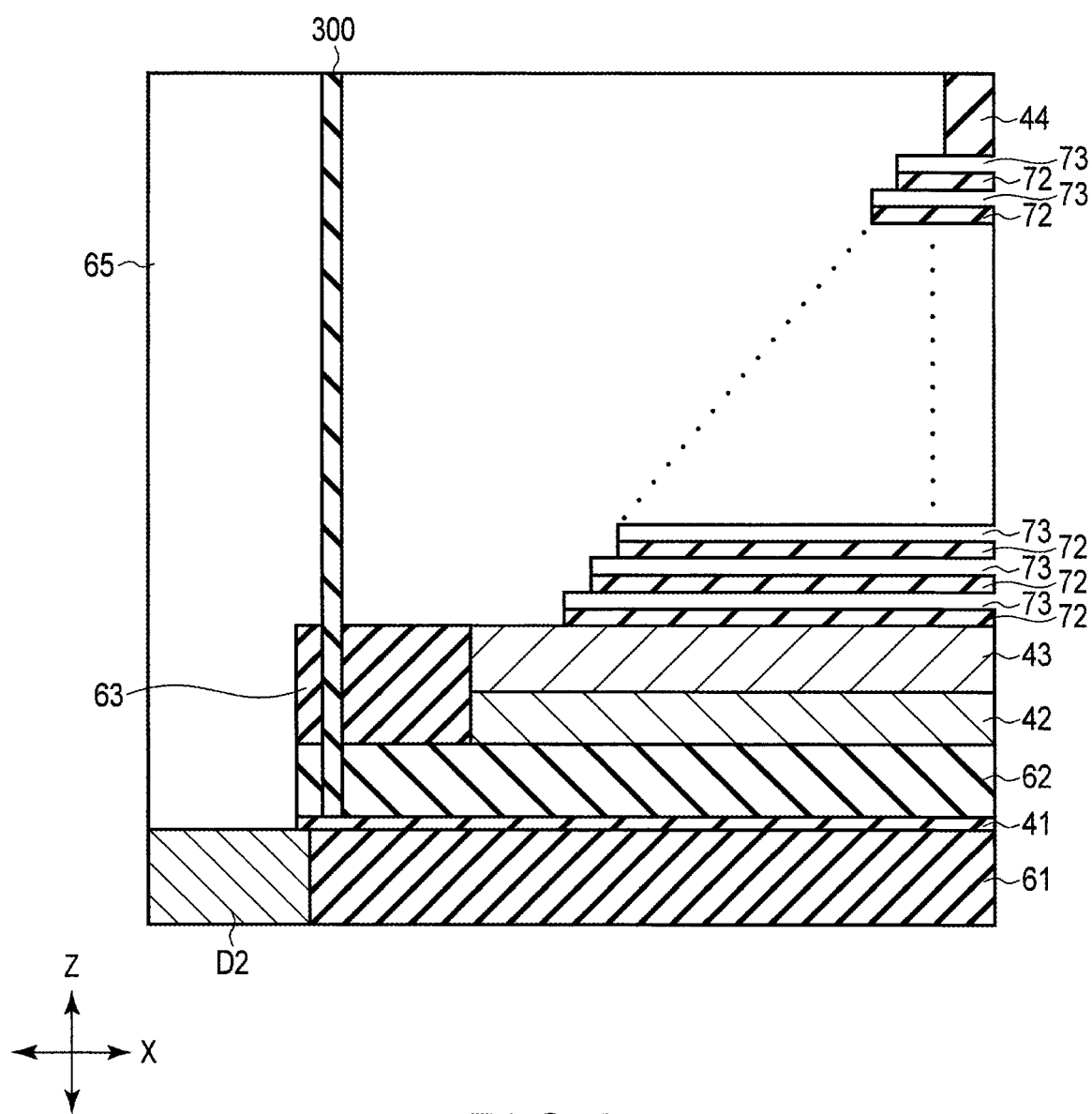
F I G. 35

SEMICONDUCTOR DEVICE AND METHOD OF MANUFACTURING THE SAME

CROSS-REFERENCE TO RELATED APPLICATIONS

The present application is a division of application Ser. No. 16/026,170, filed on Jul. 3, 2018, which claims the benefit of priority from Japanese Patent Application No. 2018-49280, filed Mar. 16, 2018, the entire contents of which are incorporated herein by reference.

FIELD

Embodiments described herein relate generally to a semiconductor device and a method of manufacturing the same.

BACKGROUND

NAND-type flash memories having three-dimensionally arranged memory cells are known.

BRIEF DESCRIPTION OF THE DRAWINGS

FIG. 2 is a cross-sectional view of the semiconductor device according to the first embodiment.

FIG. 3 is a partially enlarged cross-sectional view of the semiconductor device according to the first embodiment.

FIG. 15 is a partially enlarged cross-sectional view of a second modification of the semiconductor device according to the first embodiment.

FIG. 17 is a partially enlarged cross-sectional view of a semiconductor device according to a second embodiment.

FIGS. 18 to 22 are cross-sectional views showing a process for manufacturing the semiconductor device according to the second embodiment.

FIG. 24 is a partially enlarged cross-sectional view of a semiconductor device according to a third embodiment.

FIGS. 25 and 26 are cross-sectional views showing a process for manufacturing the semiconductor device according to the third embodiment.

FIGS. 30 to 36 are cross-sectional views showing a process for manufacturing the semiconductor device according to the fourth embodiment.

DETAILED DESCRIPTION

Figure 1:
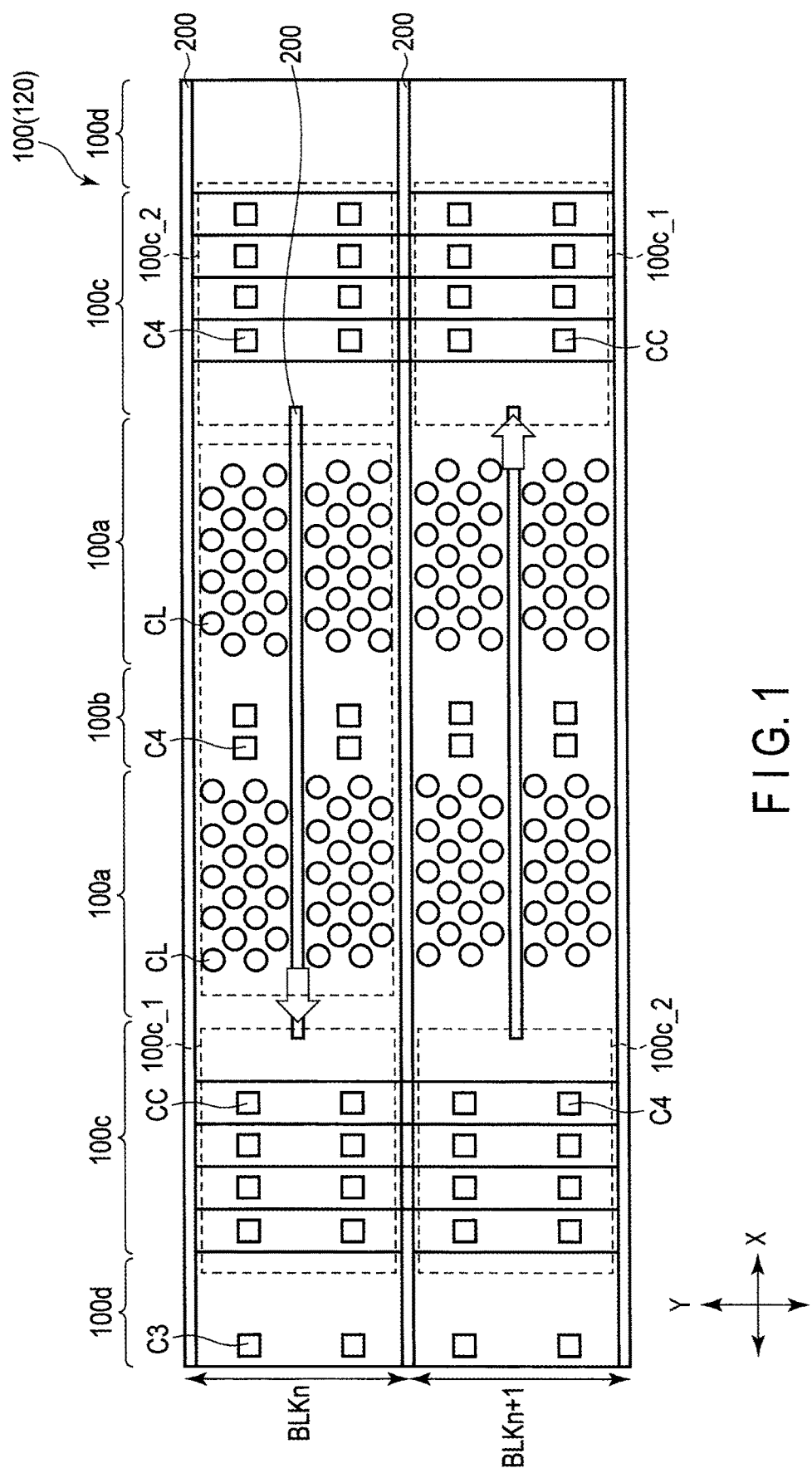
FIG. 1 is a plane view of a semiconductor device according to a first embodiment.

According to one embodiment, a semiconductor device includes a substrate, an interconnect layer, a layer stack, and a first silicon nitride layer. The interconnect layer includes a transistor provided on the substrate and a first interconnect electrically coupled to the transistor and is provided above the transistor. The layer stack is provided above the interconnect layer and includes conductive layers stacked with an insulation layer interposed between two of conductive layers of each pair of conductive layers. The first silicon nitride layer is provided between the interconnect layer and the layer stack.

Hereinafter, the embodiments will be described with reference to the accompanying drawings. In the drawings, the same parts are given the same reference signs.

First Embodiment

A semiconductor device 100 according to the first embodiment will be described below with reference to FIGS. 1 to 16. In this embodiment, a three-dimensionally-stacked type NAND flash memory will be described as an example of the semiconductor device.

[Configuration of First Embodiment]

FIG. 1 is a plane view of the semiconductor device 100 according to the first embodiment.

As shown in FIG. 1, the semiconductor device 100 includes blocks BLK (BLKn to BLKn+1) that are arranged along the Y-direction. In each block ELK, an isolation section 200 extending in the X-direction is provided in its central part that is positioned in its center along the X-direction. The isolation section 200 is also provided between the blocks BLK.

Each block ELK includes two memory cell array areas 100a, a contact area 100b, two staircase areas 100c, and two peripheral areas 100d.

The two memory cell array areas 100a and the contact area 100b are provided in a central portion of a layer stack 120. The contact area 100b is provided between the two memory cell array areas 100a. The two staircase areas 100c are provided at ends of the layer stack 120. Namely, the two memory cell array areas 100a and the contact area 100b are provided between the two staircase areas 100c. In addition, the peripheral area 100d is provided on each of the outer sides of the two staircase areas 100c (cuter sides of the layer stack 120).

The memory cell array area 100a includes pillar structures CL. The pillar structures CL are arranged in the X-direction and the Y-direction. Also, two pillar structures CL that are adjacent to each other in the X-direction (or Y-direction) are provided so as to be shifted by half a pitch in the Y-direction (or X-direction). Namely, the pillar structures CL are arranged in a staggered pattern in the X-direction and the Y-direction. The arrangement of the pillar structures CL is not limited thereto. The pillar structures CL may be provided in a matrix. Also, the shape of the pillar structures CL is a substantially circular shape in FIG. 1, as viewed in the Z-direction. However, the shape is not limited thereto.

The contact area 100b includes contacts C4. A contact C4 couples an interconnect in an upper layer of the layer stack 120 and an interconnect in a lower layer of the layer stack 120 with each other, as will be described later.

The staircase area 100c includes steps and terraces that are arranged in the X-direction. The staircase area 100c also includes steps and terraces (not shown in the drawings) that are arranged in the Y-direction. In this embodiment, a terrace is an upper surface of a part of a conductive layer 70 (which will be described later) that does not have another conductive layer 70 disposed directly thereabove, and is substantially parallel to the XY plane. Also, a step is a perpendicular surface or an inclined surface between two terraces that are adjacent to each other in the X-direction. A step is a surface formed of a side surface (end surface) of one conductive layer 70 and an end surface of one insulation layer 72, and is substantially parallel to a plane including the Y-direction.

The staircase area 100c on one side with respect to a central part (or, the two memory cell array areas 100a and the contact area 100b) includes a first contact group 100c_1. The first contact group 100c_1 includes contacts CC. Each contact CC is coupled to each terrace, and draws a word line corresponding to each layer.

The staircase area 100c on the other side with respect to the central part includes a second contact group 100c_2. The second contact group 100c_2 includes contacts C4. In a manner similar to the contact C4 of the contact area 100b, a contact C4 of the staircase area 100c couples an interconnect in an upper layer of the layer stack 120 and an interconnect in a lower layer of the layer stack 120 with each other.

In the blocks BLK that are adjacent to each other in the Y-direction, the arrangement of the first contact group 100c and the second contact group 100c_2 in the staircase areas 100c on one side with respect to the central part is opposite to that in the staircase areas 100c on the other side with respect to the central part. More specifically, in the block BLKn, the first contact group 100c_1 is provided in the staircase area 100c on one side with respect to the central part of the block BLKn (e.g., left side in FIG. 1), and the second contact group 100c_2 is provided in the staircase area 100c on the other side (e.g., right side in FIG. 1). In the block BLKn+1, the second contact group 100c_2 is provided in the staircase area 100c on one side with respect to the central part of the block BLKn+1 (e.g., left side in FIG. 1), and the first contact group 100c is provided in the staircase area 100c on the other side (e.g., right side in FIG. 1).

Namely, the staircase area 100c has word lines alternately drawn on both sides by the contacts CC in units of blocks. The contacts C4 are provided in the staircase area 100c where the contacts CC for drawing the word lines are not provided.

The arrangement of the first contact group 100c_1 and the second contact group 100c_2 is not limited thereto, but may be discretionarily set. For example, the arrangement of the first contact group 100c_1 and the second contact group 100c_2 with respect to the central part may be reversed for every two blocks BLK or more.

The peripheral area 100d includes contacts C3. In a manner similar to the contact C4, a contact C3 couples an interconnect in the upper layer of the layer stack 120 and an interconnect in the lower layer of the layer stack 120 with each other, as will be described later.

The shape of the contacts CC, C3, and C4 is a rectangular shape in FIG. 1, as viewed in the Z-direction. However, the shape of the contacts CC, C3, and C4 is not limited thereto, but may be a substantially circular shape.

FIG. 2 is a cross-sectional view of the semiconductor device 100 according to the first embodiment. In FIG. 2, an interlayer insulation layer is omitted, as appropriate.

In the descriptions provided below, a direction perpendicular to the X-direction and the Y-direction is defined as the Z-direction (stacking direction). Also, in the Z-direction, a direction from a substrate 10 toward the layer stack 120 is referred to as "upward," and a direction from the layer stack 120 toward the substrate 10 is referred to as "downward." The terms are used for convenience, and are unrelated to the direction of gravity.

The semiconductor device 100 includes an interconnect layer 110 and the layer stack 120 that are provided above the substrate 10, as shown in FIG. 2.

The substrate 10 is a semiconductor substrate, and is, for example, a silicon substrate mainly containing silicon.

The interconnect layer 110 is provided on the substrate 10. The interconnect layer 110 includes a transistors Tr, contacts Ca, C1, and C2, and interconnects D0, D1, and D2, and forms a control circuit. The transistors Tr are provided on the substrate 10. A source/drain region and a gate of a transistor Tr are coupled, via a contact Ca, to an interconnect D0 disposed thereabove. An interconnect D0 is coupled, via a contact C1, to an interconnect D1 disposed thereabove. An interconnect D1 is coupled, via a contact C2, to an interconnect D2 disposed thereabove.

A silicon nitride layer 41 is provided above the interconnect layer 110 (interconnects D2). The silicon nitride layer 41 extends in the X-direction and the Y-direction, and is provided over the entire region. A tungsten silicide layer 42 and a polysilicon layer 43 are provided above the silicon nitride layer 41 in the mentioned order. A source line is constituted by a layer stack formed of the tungsten silicide layer 42 and the polysilicon layer 43.

The layer stack 120 is provided above the polysilicon layer 43. The layer stack 120 includes conductive layers 70 and insulation layers 72. The conductive layers 70 and the insulation layers 72 are alternately stacked.

The pillar structures CL are provided in the layer stack 120 in the memory cell array area 100a. The pillar structures CL extends in the stacking direction (Z-direction) in the layer stack 120. An upper end of a pillar structure CL is coupled to an interconnect M0, which is a bit line, via a contact Cb.

A contact CC is coupled to each terrace of the layer stack 120 in the staircase area 100c on one side. An upper end of a contact CC is coupled to an interconnect M0 via a contact Cb.

The contacts C4 are provided in the layer stack 120 in the staircase area 100c on the other side and in the contact area 100b. The contacts C4 extend in the layer stack 120 and in the tungsten silicide layer 42, polysilicon layer 43, and silicon nitride layer 41, in the stacking direction. A lower end of a contact C4 is coupled to an interconnect D2. An upper end of a contact C4 is coupled to an interconnect M0 via a contact Cb.

Also, the contacts C3 are provided in the peripheral area 100d. A lower end of a contact C3 is coupled to an interconnect D2. An upper end of a contact C3 is coupled to an interconnect M0 via a contact Cb.

FIG. 3 is a partially enlarged cross-sectional view of the semiconductor device 100 according to the first embodiment, and is a cross-sectional view showing a part indicated by the broken line A (memory cell array area 100a) in FIG. 2.

The layer stack 120 is provided on the polysilicon layer 43, as shown in FIG. 3. The layer stack 120 includes conductive layers 70 and insulation layers 72. The conductive layers 70 are stacked in a direction (Z-direction) perpendicular to a main surface of the substrate 10, while having an insulation layer (insulator) 72 between two conductive layers 70 of each pair of conductive layers 70. Namely, the conductive layers 70 and the insulation layers 72 are alternately stacked. An insulation layer 44 is provided on the layer stack 120.

The conductive layers 70 are, for example, metal layers. The conductive layers 70 are, for example, tungsten layers including tungsten as a main component, or molybdenum layers including molybdenum as a main component. The insulation layers 44 and 72 are, for example, silicon oxide layers including silicon oxide as a main component.

The pillar structures continuously extend in the insulation layer 44 and in the layer stack 120 in the stacking direction (Z-direction). The pillar structures CL include a core layer 50, a semiconductor layer 20, and a memory layer 30, which are provided in the mentioned order from the center.

The core layer 50 is provided as a central portion in a pillar structure CL. The core layer 50 is, for example, a silicon oxide layer including silicon oxide as a main component.

A semiconductor layer 20 is provided around the core layer 50 in a pillar structure CL. Namely, the semiconductor layer 20 is provided between the core layer 50 and the memory layer 30. The semiconductor layer 20 includes a body layer 20b provided around the core layer 50, and a cover layer 20a provided around the body layer 20b. A lower end of the body layer 20b contacts the polysilicon layer 43.

The memory layer 30 provided around the semiconductor layer 20 in a pillar structure CL. Namely, the memory layer 30 is provided between the semiconductor layer 20 and the layer stack 120 as well as the insulation layer 44.

Figure 4:
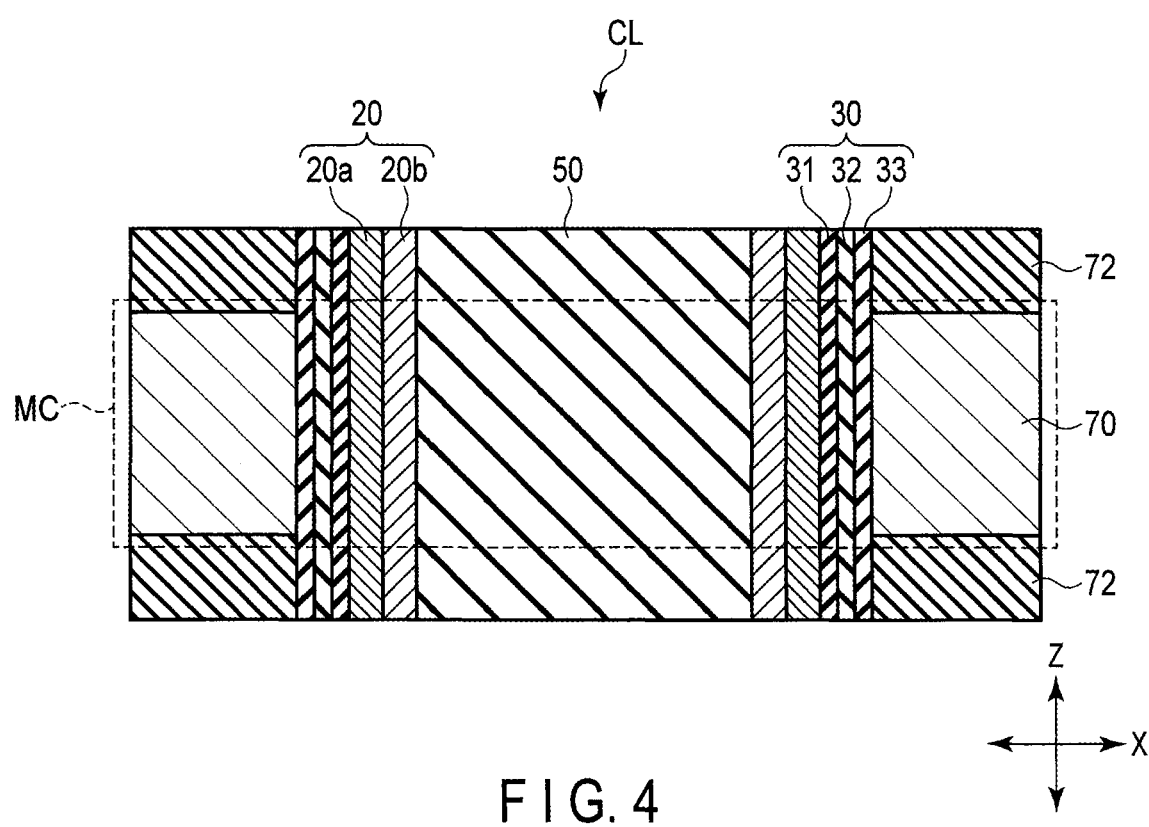
FIG. 4 is a partially enlarged cross-sectional view showing a pillar structure of the semiconductor device according to the first embodiment.

FIG. 4 is a partially enlarged cross-sectional view showing the pillar structure CL of the semiconductor device 100 according to the first embodiment.

The memory layer 30 includes a tunnel insulation layer 31, a charge trap layer 32, and a block insulation layer 33, as shown in FIG. 4.

The tunnel insulation layer 31 is provided between the semiconductor layer 20 and the charge trap layer 32. The charge trap layer 32 is provided between the tunnel insulation layer 31 and the block insulation layer 33. The block insulation layer 33 is provided between the charge trap layer 32 and the conductive layer 70 (and the insulation layer 72).

The semiconductor layer 20, the memory layer 30, and the conductive layer 70 constitute a memory cell MC. The memory cell MC has a vertical transistor structure in which the conductive layer 70 surrounds the semiconductor layer 20 via the memory layer 30. A plurality of memory cells MC are provided in the layer stack 120.

In the memory cell MC having the vertical transistor structure, the semiconductor layer 20 functions as a channel, and the conductive layer 70 functions as a control gate (word line). The charge trap layer 32 functions as a data storage layer that stores electric charge injected from the semiconductor layer 20.

The memory cell MC is, for example, a charge-trap-type memory cell. The charge trap layer 32 includes a number of trap sites to trap electric charge in an insulative layer. Also, the charge trap layer 32 is, for example, a silicon nitride layer including silicon nitride as a main component. Alternatively, the charge trap layer 32 may be a floating gate having conductivity and surrounded with an insulator.

The tunnel insulation layer 31 serves as a potential barrier when electric charge is injected from the semiconductor layer 20 into the charge trap layer 32, or when the electric charge stored in the charge trap layer 32 is discharged to the semiconductor layer 20. The tunnel insulation layer 31 is, for example, a silicon oxide layer including silicon oxide as a main component.

The block insulation layer 33 prevents the electric charge stored in the charge trap layer 32 from being discharged to the conductive layer 70. The block insulation layer 33 also prevents back tunneling of the electric charge from the conductive layer 70 to the pillar structure CL.

The block insulation layer 33 is, for example, a silicon oxide layer including silicon oxide as a main component. Also, the block insulation layer 33 may be a layer stack of a silicon oxide layer and a metal oxide layer. In this case, the silicon oxide layer is provided between the charge trap layer 32 and the metal oxide layer, and the metal oxide layer is provided between the silicon oxide layer and the conductive layer 70. Examples of the metal oxide layer include an aluminum oxide layer including aluminum oxide as a main component, a zirconium oxide layer including zirconium oxide as a main component, and a hafnium oxide layer including hafnium oxide as a main component.

Figure 5:
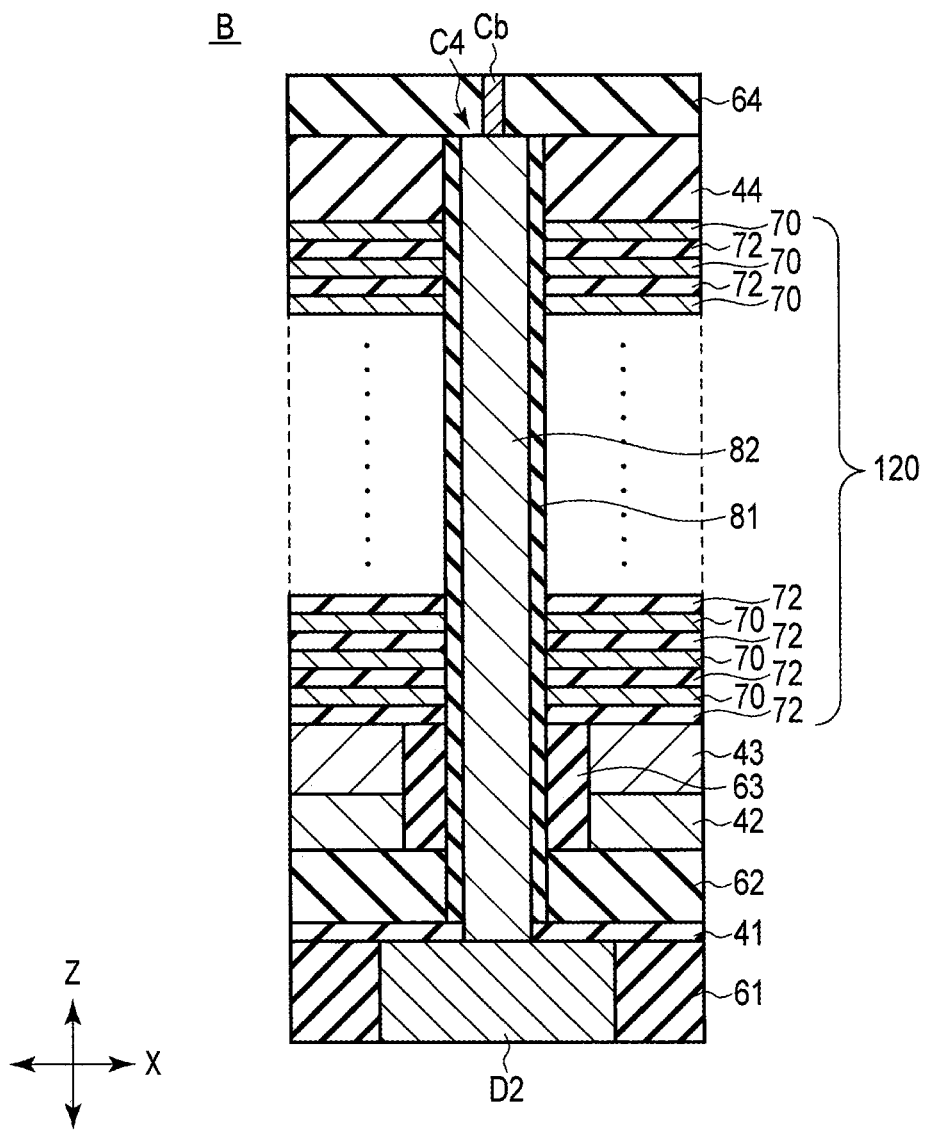
FIG. 5 is a partially enlarged cross-sectional view of the semiconductor device according to the first embodiment.

FIG. 5 is a partially enlarged cross-sectional view of the semiconductor device 100 according to the first embodiment, and is a cross-sectional view showing a part indicated by the broken line B (contact area 100b) in FIG. 2.

The interconnect D2 is provided in an insulation layer 61, as shown in FIG. 5. The interconnect D2 is a metal layer, and is, for example, a tungsten layer. The silicon nitride layer 41 is provided on the interconnect D2 and the insulation layer 61. An insulation layer 62 is provided on the silicon nitride layer 41, and the tungsten silicide layer 42 and the polysilicon layer 43 are provided on this insulation layer 62 in the mentioned order. An insulation layer 63 is provided in a contact formation area on the same level as the tungsten silicide layer 42 and the polysilicon layer 43. The layer stack 120 is formed on the polysilicon layer 43 and the insulation layer 63. Also, the insulation layer 44 is provided on the layer stack 120, and an insulation layer 64 is provided on the insulation layer 44. The insulation layers 61, 62, 63 and 64 are, for example, silicon oxide layers including silicon oxide.

The contact C4 continuously extends in the silicon nitride layer 41, in the insulation layers 44, 62, and 63, and in the layer stack 120, in the stacking direction. The contact C4 includes a metal layer 82 and a silicon oxide layer 81, which are provided in the mentioned order from the center. The lower end of the contact C4 is coupled to the interconnect D2, and the upper end of the contact C4 is coupled to the contact Cb provided in the insulation layer 64.

The metal layer 82 is provided as a central portion of the contact C4. The metal layer 82 continuously extends in the silicon nitride layer 41, in the insulation layers 44, 62, and 63, and in the layer stack 120, in the stacking direction. The metal layer 82 is, for example, a tungsten layer that includes tungsten. A lower end of the metal layer 82 is coupled to the interconnect D2, and an upper end of the metal layer 82 is coupled to the contact Cb provided in the insulation layer 64.

The silicon oxide layer 81 is provided around the metal layer 82 in the contact C4. The silicon oxide layer 31 is provided between the metal layer 82 and the insulation layers 44, 62, and 63 as well as the layer stack 120. On the other hand, the silicon oxide layer 81 is not provided between the metal layer 32 and the silicon nitride layer 41. Therefore, a side surface of the metal layer 82 is in contact with the silicon nitride layer 41. Accordingly, the interconnect layer 110 and the layer stack 120 are separated from each other by the interconnect D2 and the silicon nitride layer 41.

[Manufacturing Method of First Embodiment]

FIGS. 6 to 12 are cross-sectional views showing a process manufacturing the semiconductor device 100 according to the first embodiment. A process of manufacturing the contact C4 will be described below.

Figure 6:
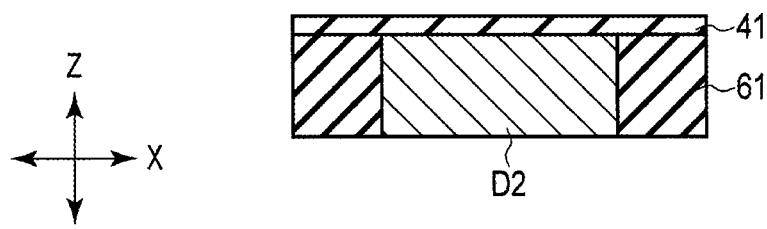
FIGS. 6 to 12 are cross-sectional views showing a process for manufacturing the semiconductor device according to the first embodiment.

First, the interconnect D2 is formed in the insulation layer 61, as shown in FIG. 6. The insulation layer 61 is, for example, a silicon oxide layer. The interconnect D2 is a metal layer, and is, for example, a tungsten layer. The interconnect D2 is formed by, for example, the damascene method. The silicon nitride layer 41 is formed on the interconnect D2 and the insulation layer 61. The silicon nitride layer 41 is formed by, for example, the low pressure (LP)—chemical vapor deposition (CVD) method.

Figure 7:
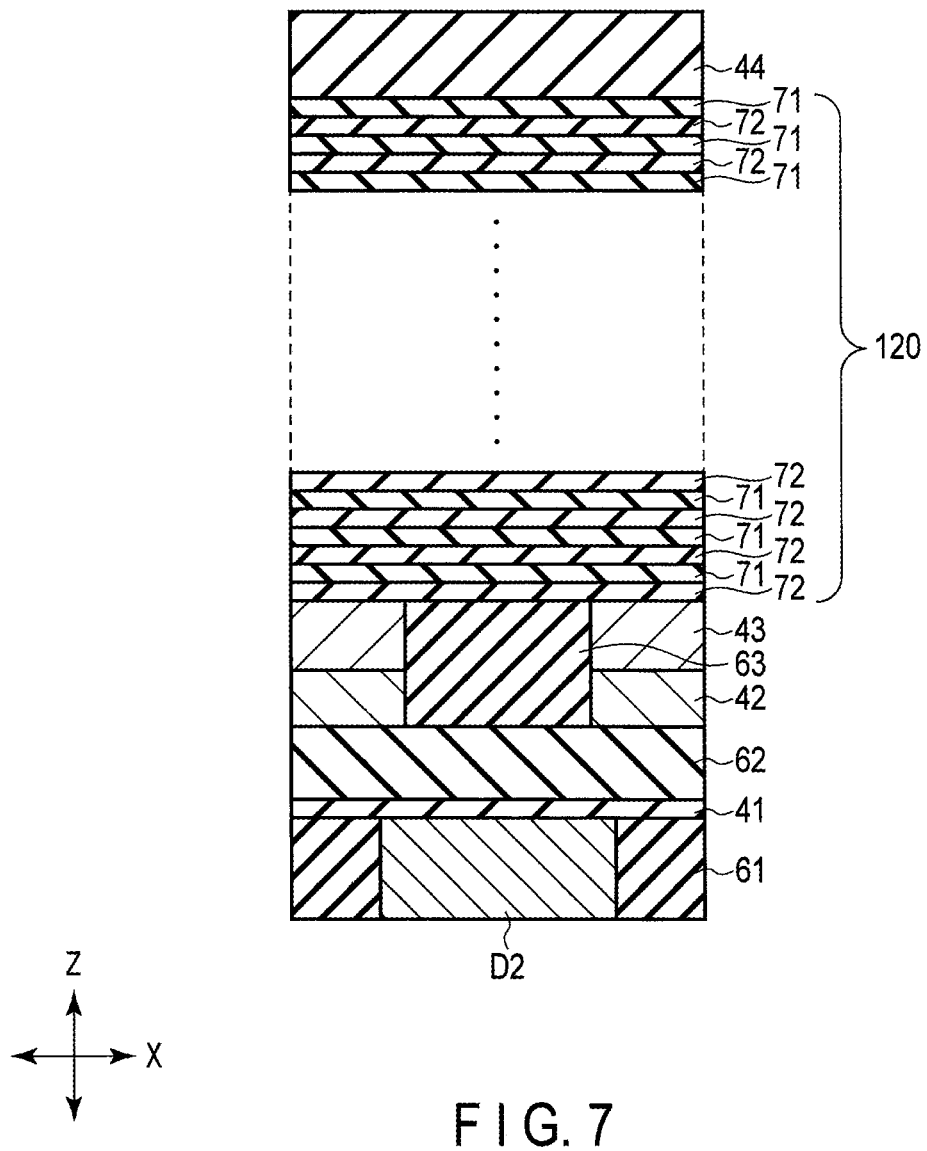

Next, the insulation layer 62 is formed on the silicon nitride layer 41, as shown in FIG. 7. The tungsten silicide layer 42 is formed on the insulation layer 62, and the polysilicon layer 43 is further formed on the tungsten silicide layer 42. The insulation layer 63 is formed in a contact formation area in the tungsten silicide layer 42 and the polysilicon layer 43.

Next, the insulation layers 72 and sacrifice layers 71 are alternately stacked on the polysilicon layer 43 and the insulation layer 63. The step of alternately stacking the insulation layer 72 and the sacrifice layer 71 is repeated, so that the layer stack 120 that includes the sacrifice layers 71 and the insulation layers 72 is formed. Furthermore, the insulation layer 44 is formed on the layer stack 120. For example, the sacrifice layers 71 are silicon nitride layers, and the insulation layers 44, 62, 63, and 72 are silicon oxide layers. The sacrifice layers 71 being silicon nitride layers are formed by, for example, the P (plasma)-CVD method.

Figure 8:
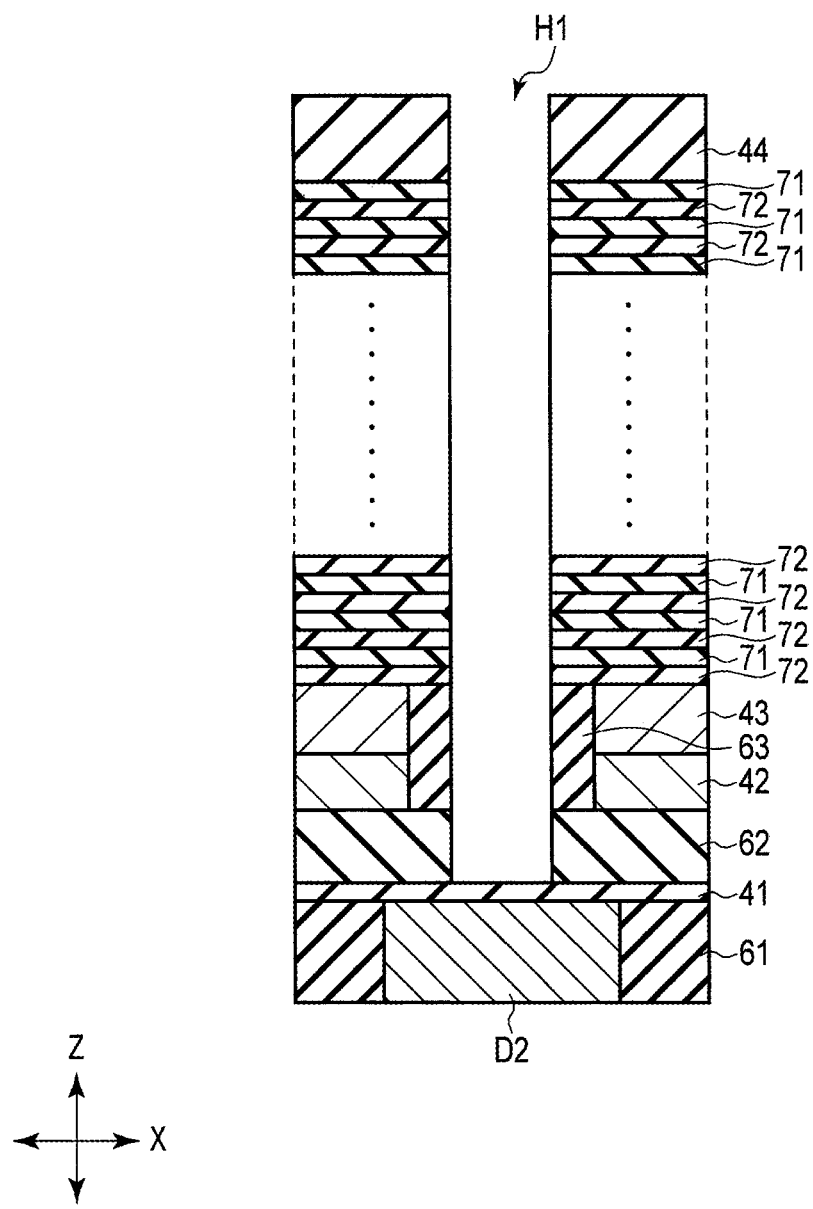

Next, a hole H1 extending in the Z-direction is formed in the insulation layers 44, 62, and 63, and the layer stack 120, as shown in FIG. 8. The hole H1 is formed by, for example, reactive ion etching (RIE) using a mask layer not shown in the drawing. The hole H1 penetrates the insulation layers 44, 62, and 63, and the layer stack 120, to reach the silicon nitride layer 41.

Figure 9:
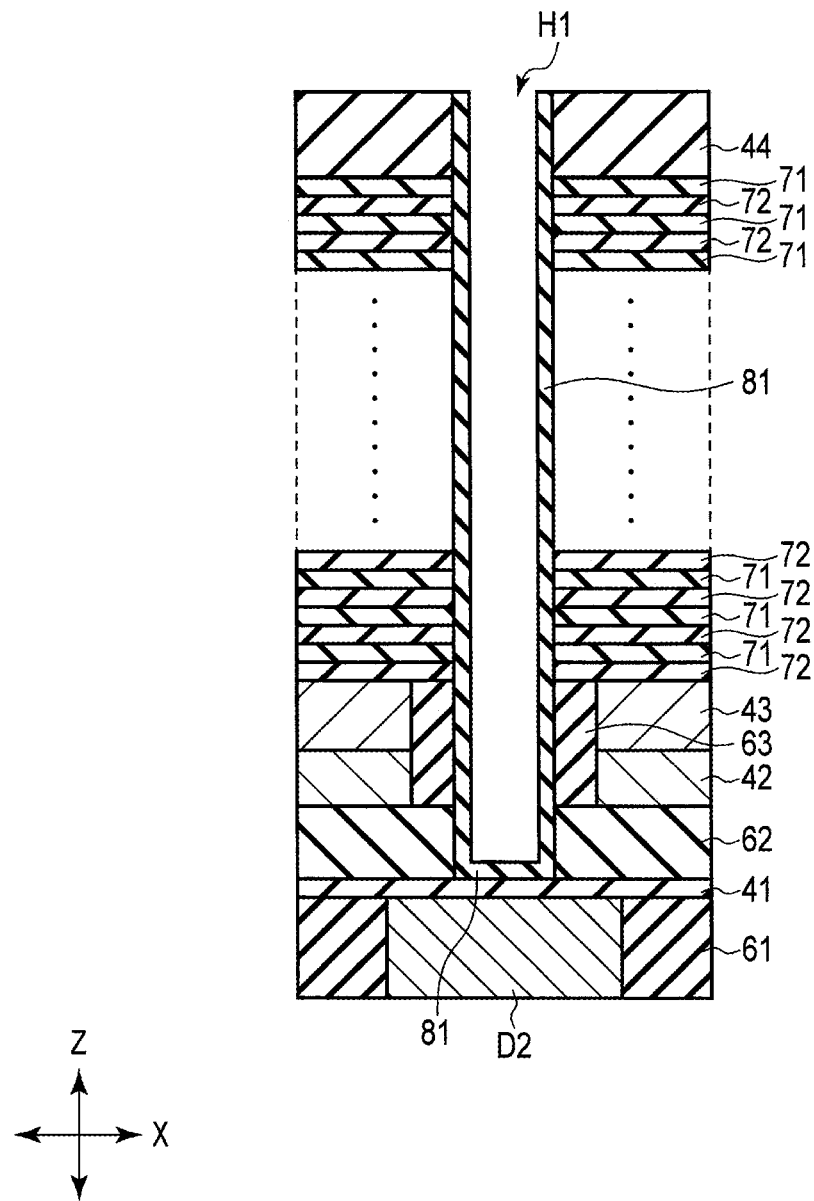

Next, the silicon oxide layer 81 is formed on the inner surfaces of the layer stack 120 and the insulation layers 44, 62, and 63 in the hole H1, and on the silicon nitride layer 41, as shown in FIG. 9. The silicon oxide layer 81 is conformally formed along the bottom and the side surface of the hole H1.

Figure 10:
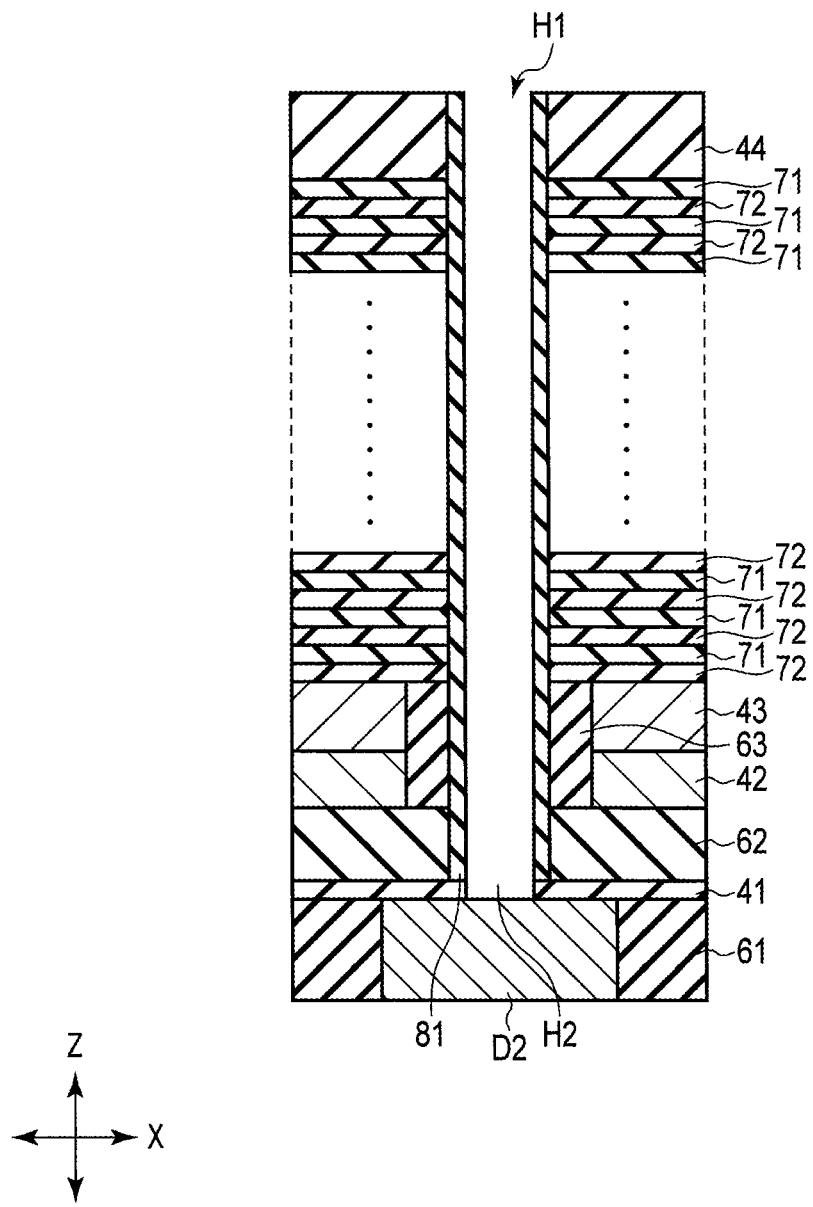

Next, as shown in FIG. 10, a portion of the silicon oxide layer 81 that is located at the bottom of the hole H1 is removed by, for example, RIE using a mask layer not shown in the drawing, so that the silicon nitride layer 41 is exposed. Furthermore, a portion of the silicon nitride layer 41 that is exposed to the bottom of the hole H1 is removed, so that a hole H2 is formed in the silicon nitride layer 41. The hole H2 penetrates the silicon nitride layer 41, to reach the interconnect D2. At this time, a diameter of the hole H2 is smaller than a diameter of the hole H1 by the layer thickness of the silicon oxide layer 81 provided on the side surface of the hole H1.

Figure 11:
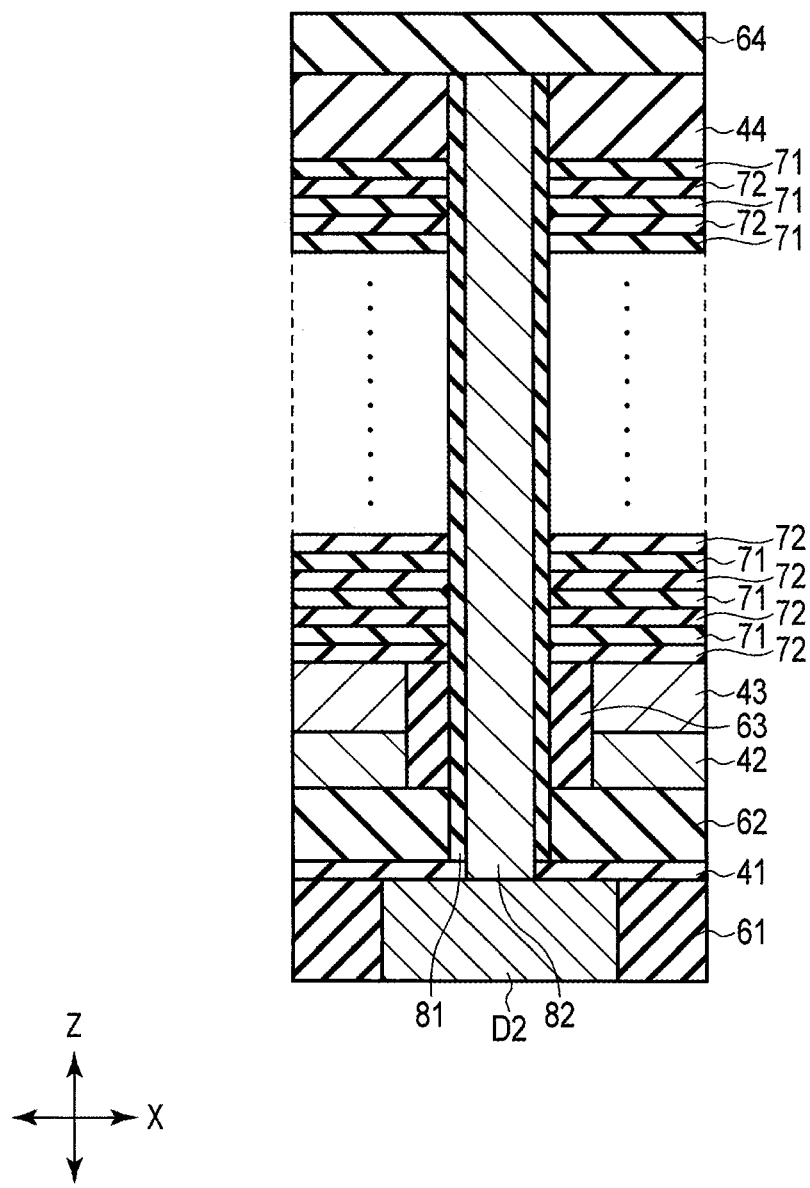

Next, the metal layer 82 is formed on the inner surface of the silicon oxide layer 81 in the hole H1, and the inner surface of the silicon nitride layer 41 in the hole H2, as shown in FIG. 11. Thereby, the holes H1 and H2 are filled. The interconnect layer 110 and the layer stack 120 are now separated from each other by the interconnect D2 and the silicon nitride layer 41. As a result, even if a thermal step is performed in the subsequent steps, diffusion of hydrogen included in the layer stack 120 into the interconnect layer 110 can be suppressed.

Thereafter, a portion of the silicon oxide layer 81 and a portion of the metal layer 82 that are provided outside the hole H1 are removed by, for example, the chemical mechanical polishing (CNP) method. Then, the insulation layer 64 is formed on the insulation layer 44, the silicon oxide layer 81, and the metal layer 82.

Next, although not shown in the drawing, slits are formed in the layer stack 120 by the RIE method using a mask layer. The slits penetrate the insulation layers 44 and 64 and the layer stack 120, to reach the polysilicon layer 43.

Figure 12:
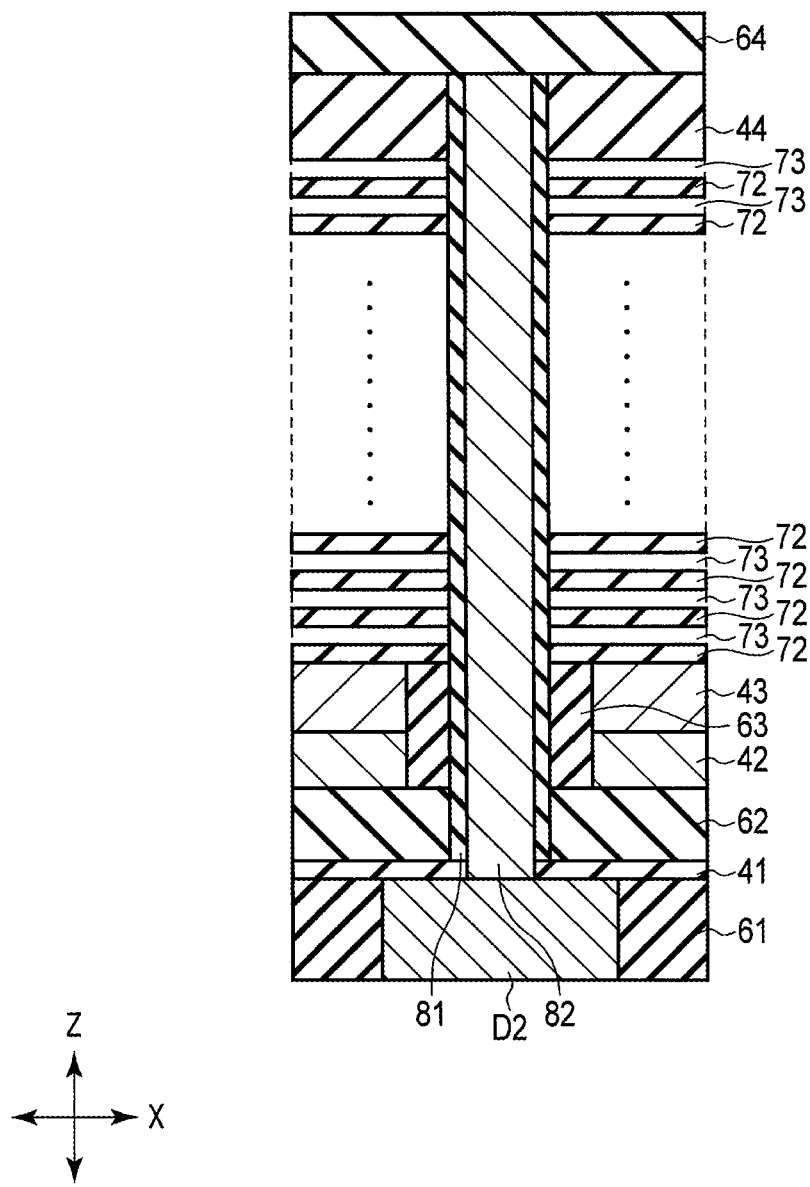

Then, the sacrifice layers 71 are removed by an etching liquid or an etching gas supplied through the slits, as shown in FIG. 12. For example, an etching liquid including phosphoric acid is used as the etching liquid. Thereby, a gap 73 is formed between every two insulation layers 72 that are vertically adjacent to each other. The gap 73 is also formed between the insulation layer 44 and the uppermost insulation layer 72 of the layer stack 120.

The insulation layers 72 of the layer stack 120 are in contact with the side surfaces of the pillar structures CL in such a manner to surround the side surfaces of the pillar structures CL. The insulation layers 72 are supported by physical joints with such pillar structures CL, and thereby the gaps 73 between the insulation layers 72 are maintained.

Next, the conductive layers 70 are formed in the gaps 73 by, for example, the CVD method, as shown in FIG. 5. At this time, a source gas is supplied to the gaps 73 through the slits.

Thereafter, an insulation layer is formed on the side surface and at the bottom of the slits, although not shown in the drawing. Thereby, the slits are filled, and the isolation section 200 shown in FIG. 1 is formed.

Furthermore, the contact Cb is formed in the insulation layer 64, and the contact Cb is coupled to the contact C4.

In this manner, the semiconductor device 100 of the first embodiment is formed.

[Advantageous Effect of First Embodiment]

In a NAND flash memory that includes three-dimensionally arranged memory cells, the layer stack 120, in which silicon oxide layers (insulation layers 72) and silicon nitride layers (sacrifice layers 71) are alternately stacked, is formed above the interconnect layer 110. When a thermal step is performed after the layer stack 120 is formed, hydrogen included in the layer stack 120 (in particular, silicon nitride layers) is diffused. The diffused hydrogen enters the interconnect layer 110 arranged below the layer stack 120, and negatively affects the properties of the transistors Tr, etc., in the interconnect layer 110. Thereby, the electrical properties of the interconnect layer 110 deteriorate.

In contrast, in the first embodiment described above, the silicon nitride layer 41 is provided between the interconnect layer 110 and the layer stack 120. This silicon nitride layer 41 functions as a barrier layer that prevents intrusion of the hydrogen. Thereby, it is possible to prevent the hydrogen diffused from the layer stack 120 from entering the interconnect layer 110 in the thermal step in the manufacturing process. As a result, it possible to suppress deterioration of the electrical properties of the interconnect layer 110.

Whereas the silicon nitride layers (sacrifice layers) 71 in the layer stack 120 are formed by the P-CVD method, the silicon nitride layer 41 is formed by the LP-CVD method. The silicon nitride layer 41 formed by the LP-CVD method does not diffuse hydrogen into the interconnect layer 110, and functions as a barrier layer.

Figure 13:
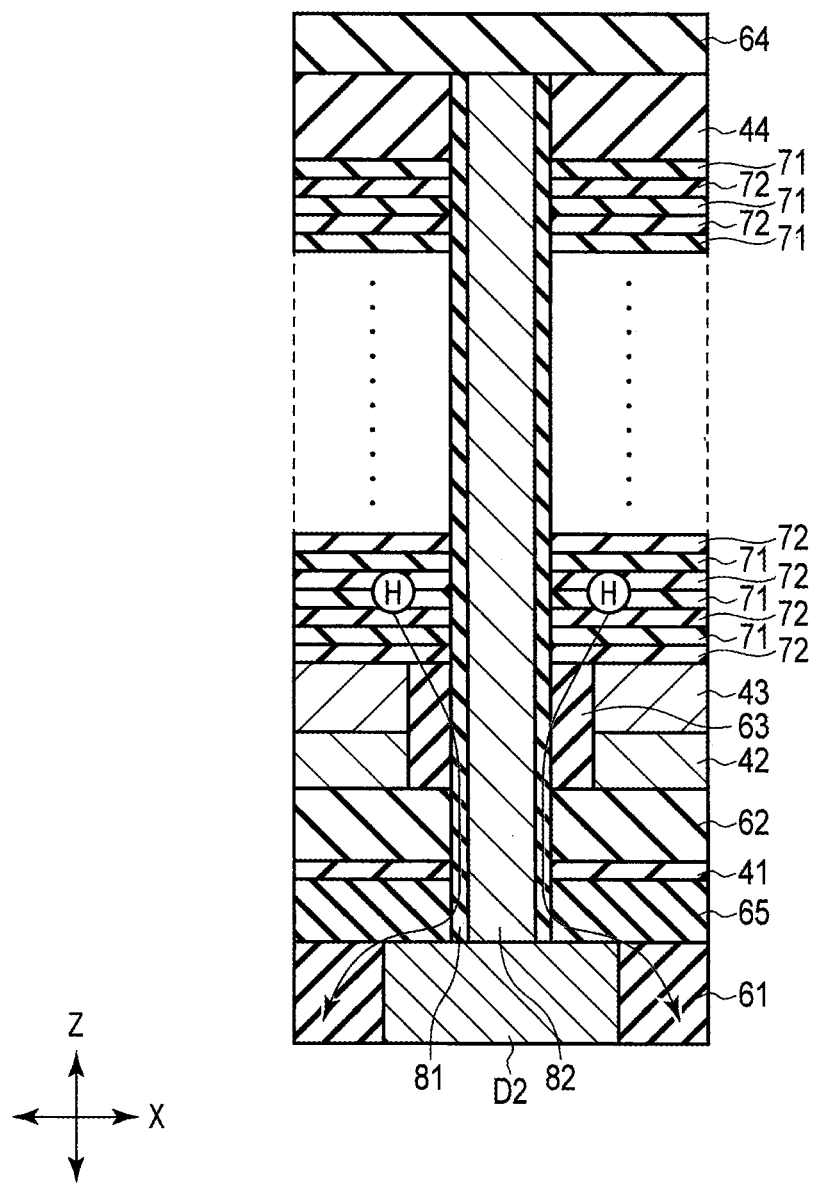
FIG. 13 is a cross-sectional view showing a comparative example of the process for manufacturing the semiconductor device according to the first embodiment.

FIG. 13 is a cross-sectional view showing a comparative example of the process for manufacturing the semiconductor device 100 according to the first embodiment.

Even if the silicon nitride layer 41 as a barrier layer is formed, hydrogen from the layer stack 120 may diffuse into the interconnect layer 110 when the contact C4 is formed, as shown in the comparative example of FIG. 13. For example, in the comparative example, an insulation layer 65 made of a silicon oxide layer is provided between the silicon nitride layer 41 and the interconnect D2. Also, the silicon oxide layer 81 serving as a sidewall spacer of the contact C4 is formed in the silicon nitride layer 41. The silicon oxide layer cannot prevent intrusion of hydrogen from the layer stack 120. Therefore, in the comparative example, although the silicon nitride layer 41 is formed, hydrogen from the layer stack 120 enters the interconnect layer 110 via the silicon oxide layer Si and the insulation layer 65 (silicon oxide layer) when the contact C4 is formed.

In contrast, in the first embodiment described above, the silicon oxide layer 81 not formed in the silicon nitride layer 41. Namely, the metal layer 82 and the silicon nitride layer 41 are formed in contact with each other. Also, the silicon nitride layer 41 is formed directly on the interconnect D2 (in contact with the interconnect D2). Thereby, in the first embodiment described above, a pathway of intrusion of hydrogen by the silicon oxide layers (silicon oxide layer 81 and insulation layer 65) shown in the comparative example is blocked. Accordingly, it is possible to prevent the hydrogen diffused from the layer stack 120 from entering the interconnect layer 110 when the contact C4 is formed.

[Modification of First Embodiment]

Figure 14:
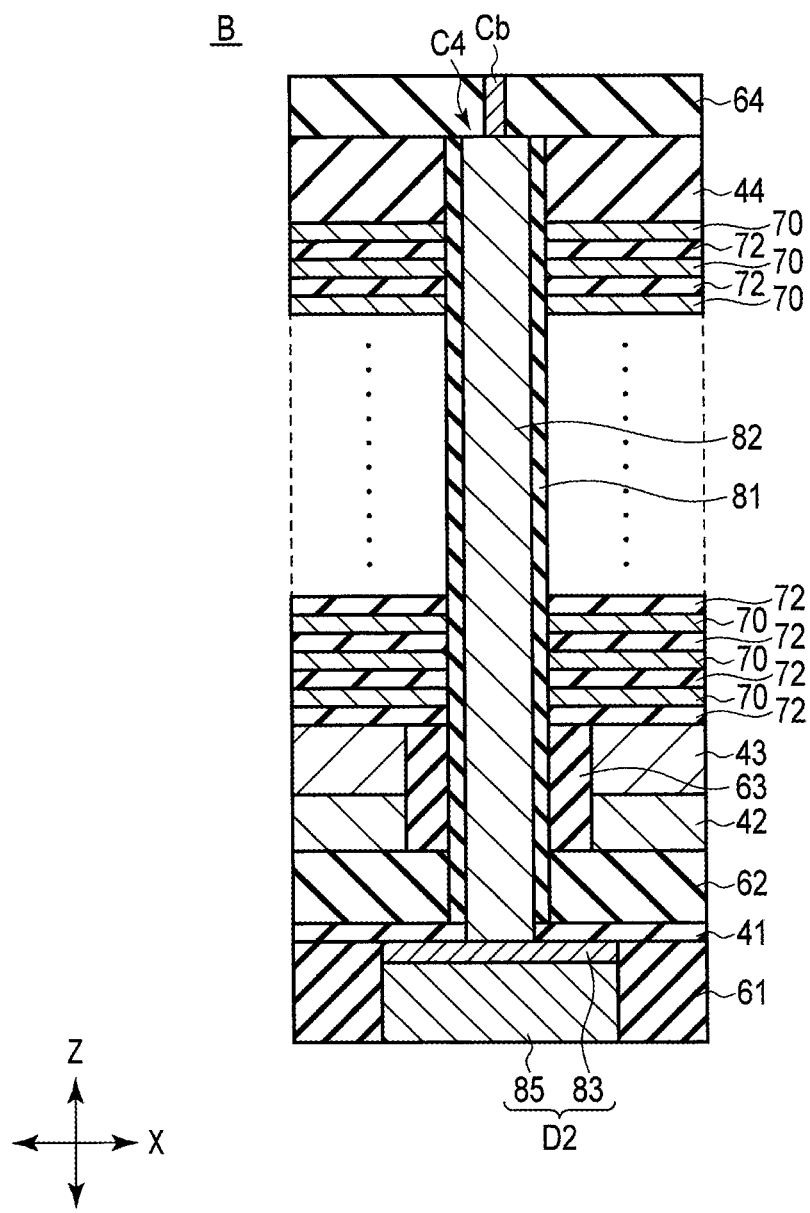
FIG. 14 is a partially enlarged cross-sectional view of a first modification of the semiconductor device according to the first embodiment.

FIG. 14 is a partially enlarged cross-sectional view showing a first modification of the semiconductor device 100 according to the first embodiment, and is a cross-sectional view showing a modification of the part indicated by the broken line B (contact area 100b) in FIG. 2.

In the first modification, the interconnect D2 includes a metal layer 85 and a polysilicon layer 83, as shown in FIG. 14. The polysilicon layer 83 is provided on the metal layer 85. The metal layer 85 is, for example, a tungsten layer. A barrier metal layer (not shown in the drawing) that is a titanium or titanium nitride layer is provided between the metal layer 85 and the polysilicon layer 83. The silicon nitride layer 41 is provided on the interconnect D2 and the insulation layer 61. The metal layer 82 of the contact C4 is provided in a manner contacting the polysilicon layer 83 of the interconnect D2.

In the first modification, the polysilicon layer 83 is provided on the metal layer 85 as the interconnect D2. Thereby, the interconnect layer 110 and the layer stack 120 are separated from each other by the polysilicon layer 83 and the silicon nitride layer 41. The polysilicon layer 83 functions as a barrier layer that prevents intrusion of hydrogen. Thereby, it is possible to prevent the hydrogen diffused from the layer stack 120 from entering the interconnect layer 110 in the thermal step in the manufacturing process. As a result, deterioration of the electrical properties of the interconnect layer 110 can be suppressed.

FIG. 15 is a partially enlarged cross-sectional view showing a second modification of the semiconductor device 100 according to the first embodiment, and is a cross-sectional view showing a modification of the part indicated by the broken line B (contact area 100b) in FIG. 2.

In the second modification, the contact C4 includes the metal layer 82 and the silicon oxide layer 81, which are provided in the mentioned order from the center, as shown in FIG. 15. Also, the contact C4 includes a polysilicon layer 84 in place of a part of a lower end portion of the metal layer 82. The polysilicon layer 84 is provided so as to be continuous with the metal layer 82, and is provided on the inner surface of the silicon oxide layer 81 in a manner similar to the metal layer 82. The polysilicon layer 84 is also formed in the silicon nitride layer 41, and a lower end of the polysilicon layer 84 is coupled to the interconnect D2. A barrier metal layer (not shown in the drawing) that is a titanium or titanium nitride layer is provided between the metal layer 82 and the polysilicon layer 84.

After the hole H2 is formed in the silicon nitride layer 41 (i.e., after the step shown in FIG. 10), the polysilicon layer 84 is formed at the bottom of the holes H1 and H2. The polysilicon layer 84 may be formed by being etched back after the holes H1 and H2 are filled by the polysilicon layer 84.

In the second modification, the polysilicon layer 84 is provided below the metal layer 82. Thereby, the interconnect layer 110 including the interconnect D2 and the layer stack 120 are separated from each other by the polysilicon layer 84 and the silicon nitride layer 41. The polysilicon layer 84 functions as a barrier layer that prevents intrusion of hydrogen. Thereby, it is possible to prevent the hydrogen diffused from the layer stack 120 from entering the interconnect layer 110 in the thermal step in the manufacturing process. As a result, deterioration of the electrical properties of the interconnect layer 110 can be suppressed.

Figure 16:
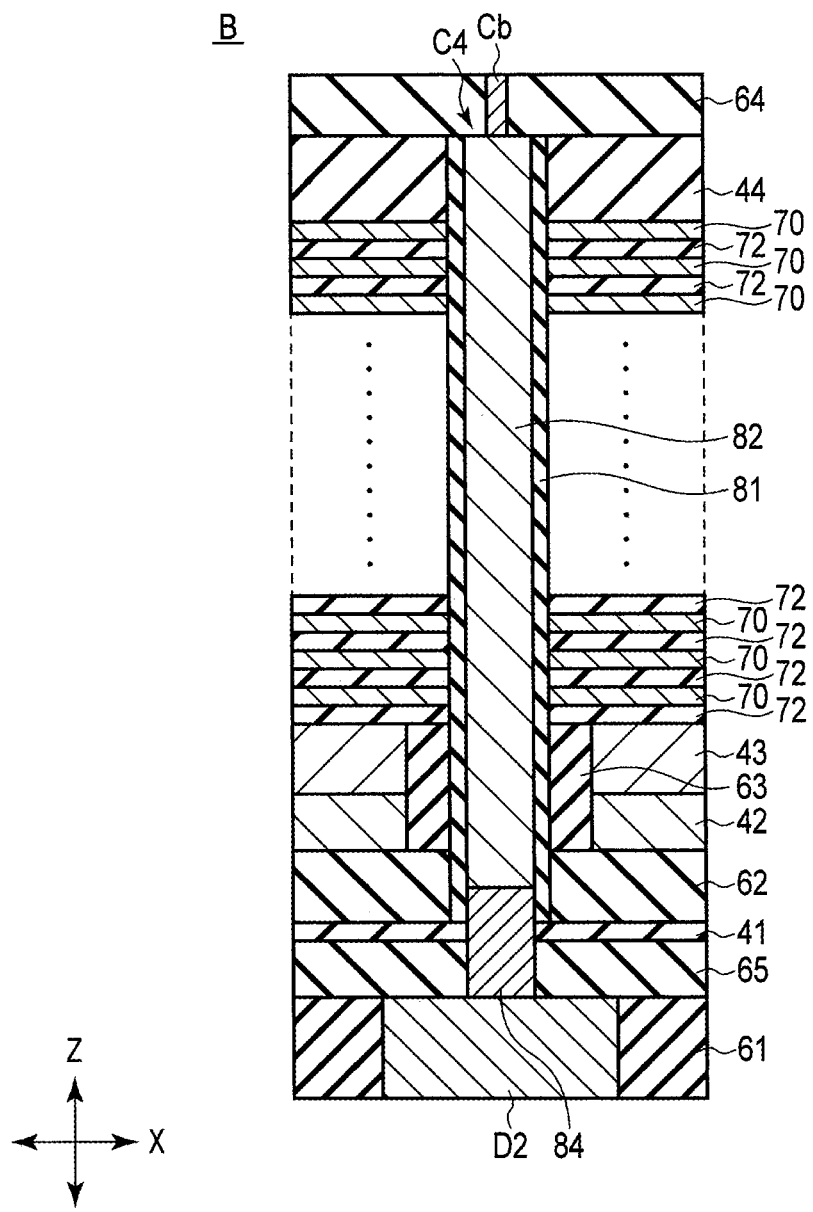
FIG. 16 is a partially enlarged cross-sectional view of the second modification of the semiconductor device according to the first embodiment.

The insulation layer 65 made of a silicon oxide layer may be provided between the silicon nitride layer 41 and the interconnect D2, as shown in FIG. 16. In this case, an upper end of the polysilicon layer 84 is located at a position higher than an upper end of the insulation layer 65.

Second Embodiment semiconductor device 100 according to the second embodiment will be described below with reference to FIGS. 17 to 23. The second embodiment is an example in which silicon nitride layers 86 and 87 are provided in a manner to cover the side surface and upper surface of the metal layer 82 in the contact C4. The second embodiment will be detailed below.

In the second embodiment, descriptions of the same points as the above first embodiment will be omitted, and mainly the different points will be described.

[Configuration of Second Embodiment]

FIG. 17 is a partially enlarged cross-sectional view of the semiconductor device 100 according to the second embodiment, and is a cross-sectional view showing the part indicated by the broken line B (contact area 100b) in FIG. 2.

The contact C4 continuously extends in the silicon nitride layer 41, in the insulation layers 44, 62, and 63, and in the layer stack 120, in the stacking direction. The contact C4 includes the metal layer 82, the silicon nitride layer 86, and the silicon oxide layer 81, which are provided in the mentioned order from the center. The contact C4 also includes the silicon nitride layer 87 that covers the upper surface (upper end) of the metal layer 82.

The metal layer 82 is provided as a central portion of the contact C4. The metal layer 82 continuously extends in the silicon nitride layer 41, in the insulation layers 44, 62, and 63, and in the layer stack 120, in the stacking direction. The metal layer 82 is, for example, a tungsten layer that includes tungsten. The lower end of the metal layer 82 is connected to the interconnect D2, and the upper end of the metal layer 82 is connected to the contact Cb provided in the insulation layer 64.

The silicon nitride layer 86 is provided around the metal layer 82 in the contact C4. The silicon nitride layer 86 is provided between the metal layer 82 and the silicon oxide layer 81, and between the metal layer 82 and the silicon nitride layer 41. The silicon nitride layer 86 continuously extends in the silicon nitride layer 41, in the insulation layers 44, 62, and 63, and in the layer stack 120, in the stacking direction.

The silicon nitride layer 87 is provided in a manner to cover the upper surface of the metal layer 32 in the contact C4. The silicon nitride layer 87 is provided in an area where a part of the upper end portion of the metal layer 82 has been removed. Therefore, the silicon nitride layer 86 is provided around the silicon nitride layer 87, and the side surface of the silicon nitride layer 87 is in contact with the silicon nitride layer 86. The contact Cb continuously extends in the silicon nitride layer 87 in the stacking direction, to be coupled to the metal layer 82.

The silicon oxide layer 81 is provided around the silicon nitride layer 86 in the contact C4. The silicon oxide layer 81 is provided between the silicon nitride layer 86 and the insulation layers 44, 62, and 63 as well as the layer stack 120. On the other hand, the silicon oxide layer 81 is not provided between the silicon nitride layer 86 and the silicon nitride layer 41. Therefore, the side surface of the silicon nitride layer 86 is in contact with the silicon nitride layer 41. Accordingly, the silicon nitride layers 41, 86, and 87 are consecutively provided. As a result, the interconnect layer 110 and the layer stack 120 are separated from each other by the silicon nitride layers 41, 86, and 87.

[Manufacturing Method of Second Embodiment]

FIGS. 18 to 22 are cross-sectional views showing a process of manufacturing the semiconductor device 100 according to the second embodiment. A process of manufacturing the contact C4 will be described below.

First, the steps until the step shown in FIG. 10 of the first embodiment are performed. Namely, after the silicon oxide layer 81 is formed inside the hole H1, the hole H2 is formed in the silicon nitride layer 41.

Figure 18:
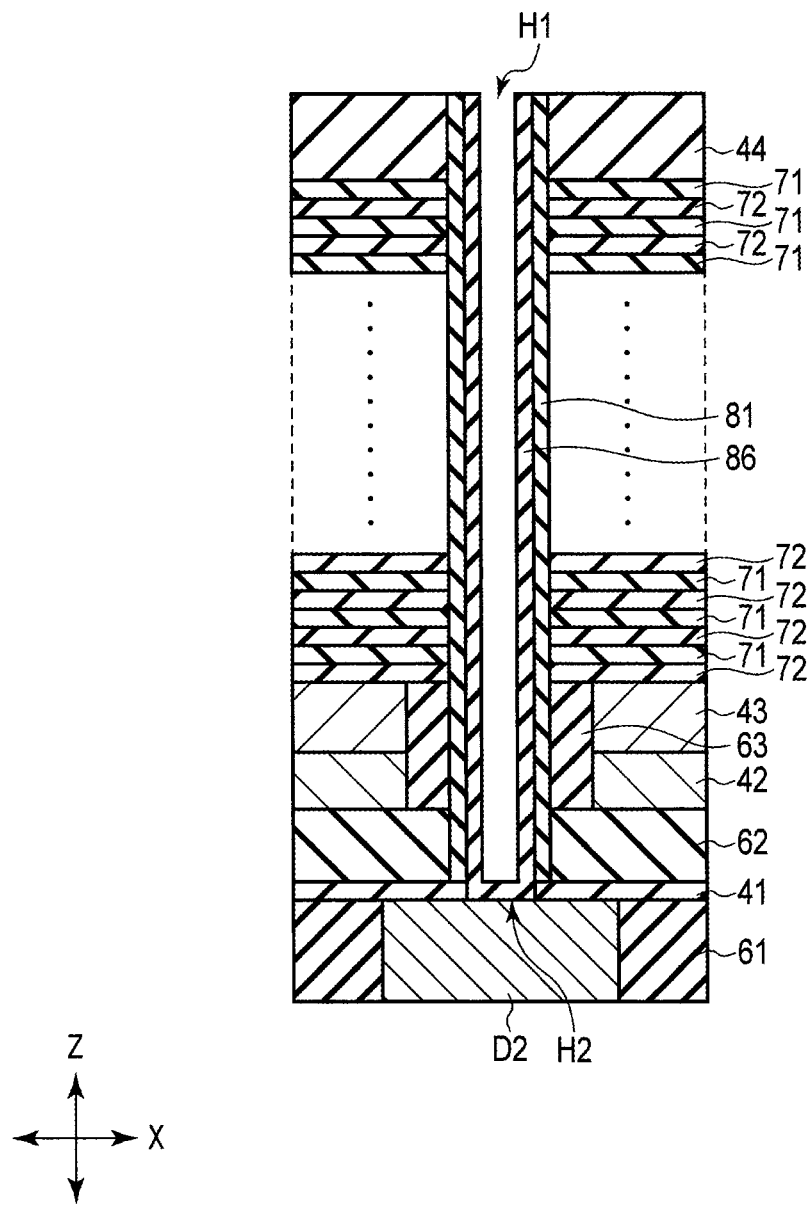

Next, the silicon nitride layer 86 is formed on the inner surface of the silicon oxide layer 81 in the hole H1, and inner surface of the silicon nitride layer 41 in the hole H2, as shown in FIG. 18. The silicon nitride layer 86 is coformally formed along the bottom and the side surface of the holes H1 and H2. The silicon nitride layer 86 is formed by the LP-CVD method.

Figure 19:
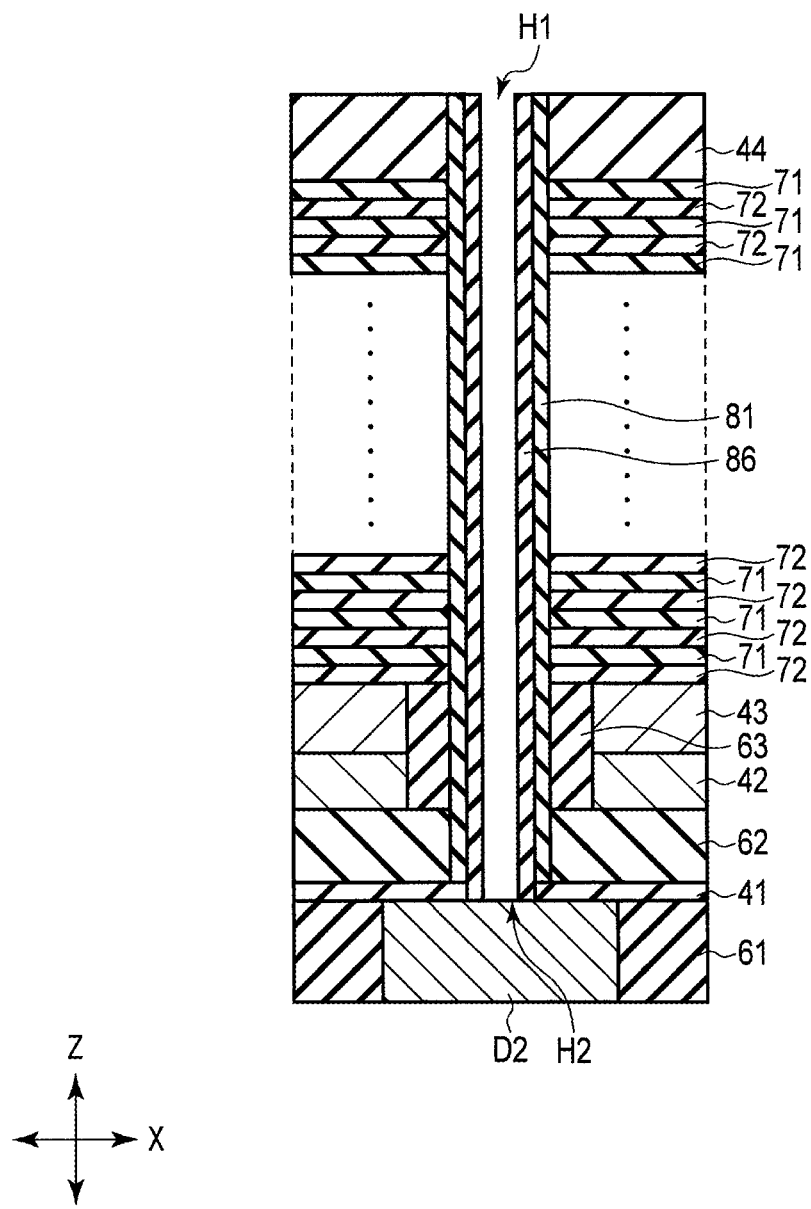

Next, a portion of the silicon nitride layer 86 that is located at the bottom of the hole H2 is removed by, for example, RIE using a mask layer not shown in the drawing, so that the interconnect D2 is exposed, as shown in FIG. 19.

Next, the metal layer 82 is formed on the inner surface of the silicon nitride layer 86 in the holes H1 and H2, as shown in FIG. 20. Thereby, the holes H1 and H2 are filled. Thereafter, a part of the upper end portion of the metal layer 82 in the hole H1 is removed by etch-back processing.

Figure 21:
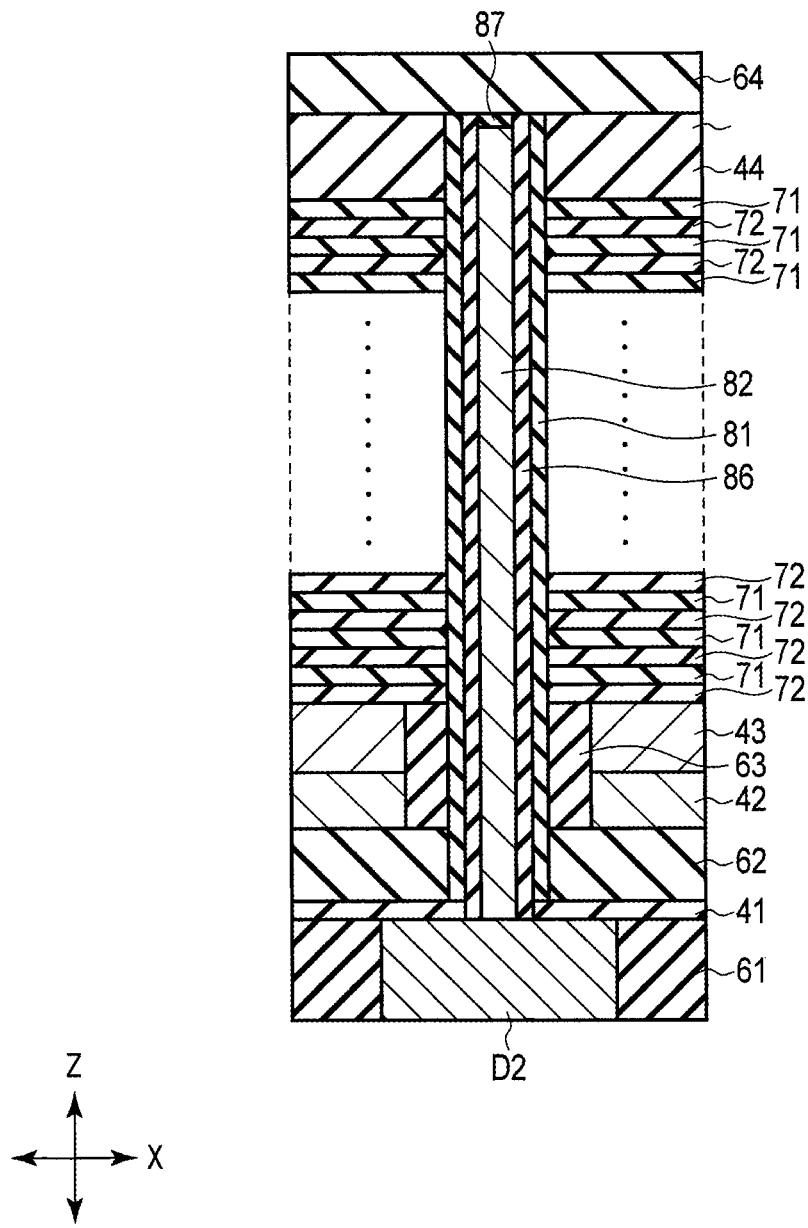

Next, the silicon nitride layer 87 is formed in an area in the hole H1 where the metal layer 82 has been removed, as shown in FIG. 21. The silicon nitride layer 87 is formed by the LP-CVD method. The interconnect layer 110 and the layer stack 120 are now separated from each other by the silicon nitride layers 41, 86, and 87. As a result, even if a thermal step is performed in the subsequent steps, diffusion of hydrogen included in the layer stack 120 into the interconnect layer 110 can be suppressed.

Thereafter, a portion of the silicon oxide layer 81, a portion of the silicon nitride layers 86 and 87, and a portion of the metal layer 82 that are located outside the hole H1 are removed by, for example, the CMP method. Then, the insulation layer 64 is formed on the insulation layer 44, the silicon oxide layer 81, the silicon nitride layers 86 and 87, and the metal layer 32.

Next, although not shown in the drawing, slits are formed in the layer stack 120 by the RIE method using a mask layer. The slits penetrate the insulation layers 44 and 64 and the layer stack 120, to reach the polysilicon layer 43. Then, the sacrifice layers 71 are removed by an etching liquid or an etching gas supplied through the slits, shown in FIG. 22.

Thereby, the gap 73 is formed between every two insulation layers 72 that are vertically adjacent to each other. The gap 73 is also formed between the insulation layer 44 and the uppermost insulation layer 72 of the layer stack 120.

Next, the conductive layers 70 are formed in the gaps 73 by, for example, the CVD method, as shown in FIG. 17. At this time, a source gas is supplied to the gaps 73 through the slits. Thereafter, an insulation layer is formed on the side surface and at the bottom of the slits, although not shown in the drawing. Thereby, the slits are filled, and the isolation section 200 shown in FIG. 1 is formed.

Furthermore, the contact Cb is formed in the insulation layer 64 and the silicon nitride layer 87. The contact Cb reaches the metal layer 82 to be coupled thereto.

In this manner, the semiconductor device 100 of the second embodiment is formed.

[Advantageous Effect of Second Embodiment]

In the second embodiment described above, the silicon nitride layer 86 is provided in a manner to cover the side surface of the metal layer 82, and the silicon nitride layer 87 is provided in a manner to cover the upper surface of the metal layer 82, in the contact C4. Thereby, the interconnect layer 110 and the layer stack 120 are separated from each other by the silicon nitride layers 41, 86, and 87. Thereby, it is possible to prevent the hydrogen diffused from the layer stack 120 from entering the interconnect layer 110 in the thermal step in the manufacturing process. As a result, deterioration of the electrical properties of the interconnect layer 110 can be suppressed.

Figure 23:
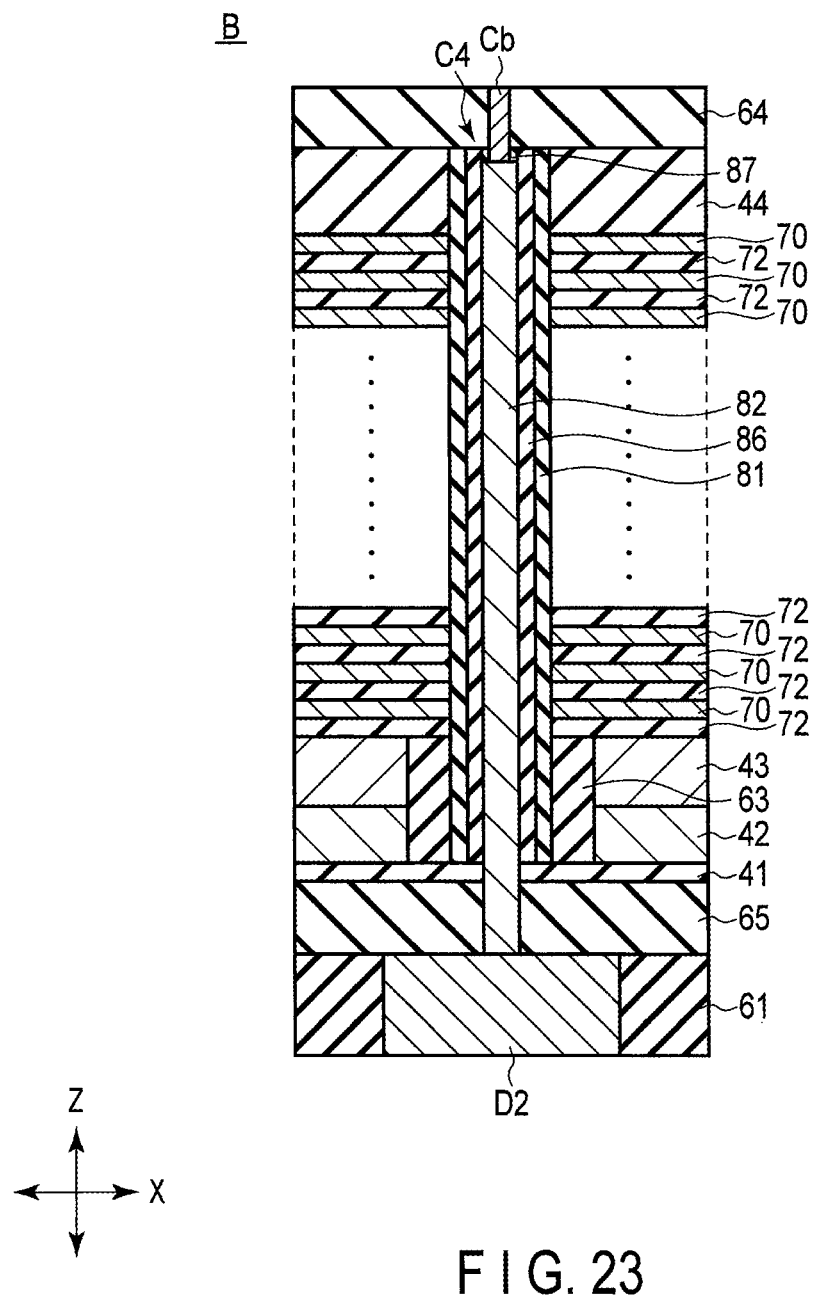
FIG. 23 is a partially enlarged cross-sectional view of a comparative example of the semiconductor device according to the second embodiment.

The insulation layer 62 may not be formed and the silicon nitride layer 41 may be provided directly below the tungsten silicide layer 42, as shown in FIG. 23. Also, the insulation layer 65 made of a silicon oxide layer may be provided between the silicon nitride layer 41 and the interconnect D2.

Third Embodiment

A semiconductor device 100 according to the third embodiment will be described below with reference to FIGS. 24 to 26. The third embodiment is an example in which the silicon nitride layer 86 is provided in a manner to cover the side surface of the metal layer 32 in the contact C4, and a silicon oxide layer 91 that includes impurities is provided on the insulation layer 44. The third embodiment will be detailed below.

In the third embodiment, descriptions of the same points as the above first embodiment will be omitted, and mainly the different points will be described.

[Configuration of Third Embodiment]

FIG. 24 is a partially enlarged cross-sectional view of the semiconductor device 100 according to the third embodiment, and is a cross-sectional view showing the part indicated by the broken line B (contact area 100b) in FIG. 2.

The contact C4 continuously extends in the silicon nitride layer 41, in the insulation layers 44, 62, and 63, and in the layer stack 120, in the stacking direction. The contact C4 includes the metal layer 82, silicon nitride layer 86, and silicon oxide layer 81, which are provided in the mentioned order from the center.

The metal layer 82 is provided as a central portion of the contact C4. The metal layer 82 continuously extends in the silicon nitride layer 41, in the insulation layers 44, and 63, and in the layer stack 120, in the stacking direction. The metal layer 82 is, for example, a tungsten layer that includes tungsten. The lower end of the metal layer 82 is connected to the interconnect D2, and the upper end of the metal layer 82 is connected to the contact Cb provided in the insulation layer 64.

The silicon nitride layer 86 is provided around the metal layer 82 in the contact C4. The silicon nitride layer 36 is provided between the metal layer 82 and the silicon oxide layer 33, and between the metal layer 82 and the silicon nitride layer 41. The silicon nitride layer 86 continuously extends in the silicon nitride layer 41, in the insulation layers 44, 62, and 63, and in the layer stack 120, in the stacking direction.

The silicon oxide layer 31 is provided around the silicon nitride layer 86 in the contact C4. The silicon oxide layer 81 is provided between the silicon nitride layer 86 and the insulation layers 44, 62, and 63 as well as the layer stack 120. On the other hand, the silicon oxide layer 81 is not provided between the silicon nitride layer 86 and the silicon nitride layer 41. Therefore, the side surface of the silicon nitride layer 86 is in contact with the silicon nitride layer 41.

The silicon oxide layer 91 is provided on the insulation layer 44 and the silicon oxide layer 81. The silicon oxide layer 91 includes at least one of phosphorus, carbon, arsenic, or argon, as impurities. The silicon oxide layer 91 is an area formed by injecting impurities into the upper end portion of the silicon oxide layer 81 and the insulation layer 44 made of a silicon oxide layer. Namely, an impurity concentration of the silicon oxide layer 91 is higher than an impurity concentration of the insulation layer 44 and the silicon oxide layer 81.

The silicon oxide layer 91 and the silicon nitride layers 41 and 86 are consecutively provided. As a result, the interconnect layer 110 and the layer stack 120 are separated from each other by the silicon oxide layer 91 and the silicon nitride layers 41 and 86.

[Manufacturing Method of Third Embodiment]

Figure 26:
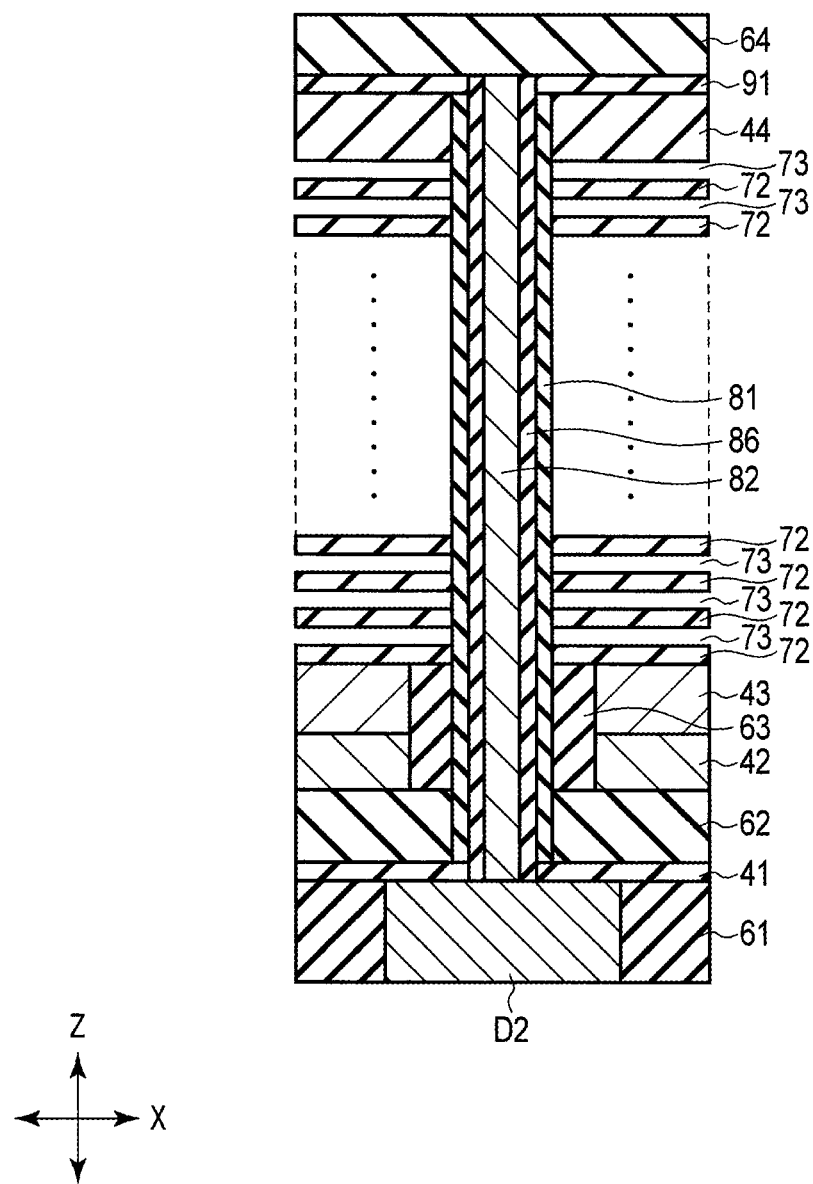

FIGS. 25 and 26 are cross-sectional views showing a process for manufacturing the semiconductor device 100 according to the third embodiment. A process of manufacturing the contact C4 will be described below.

First, the steps until the step shown in FIG. 10 of the first embodiment are performed. Namely, after the silicon oxide layer 81 is formed inside the hole H1, the hole H2 is formed in the silicon nitride layer 41.

Next, the silicon nitride layer 86 is formed on the inner surface of the silicon oxide layer 81 in the hole H1, and the inner surface of the silicon nitride layer 41 in the hole H2, as shown in FIG. 25. The silicon nitride layer 86 is conformally formed along the bottom and the side surface of the holes H1 and H2. The silicon nitride layer 86 is formed by the LP-CVD method.

Next, a portion of the silicon nitride layer 86 that is located at the bottom of the hole H2 is removed by, for example, RIE using a mask layer not shown in the drawing, so that the interconnect D2 is exposed. Thereafter, the metal layer 82 is formed on the inner surface of the silicon nitride layer 86 in the holes H1 and H2. Thereby, the holes H1 and H2 are filled. Then, a portion of the silicon oxide layer 81, a portion of the silicon nitride layer 86, and a portion of the metal layer 82 that are provided outside the hole H1 are removed by, for example, the CMP method.

Furthermore, impurities are injected into the upper end portion of the silicon oxide layer 81 and the insulation layer 44 made of a silicon oxide layer by the ion implantation method. Thereby, the silicon oxide layer 91 that includes impurities is formed on the upper end portion of the silicon oxide layer 81 and the insulation layer 44 made of a silicon oxide layer. The silicon oxide layer 91 includes at least one of phosphorus, carbon, arsenic, or argon, as impurities.

Next, the insulation layer 64 is formed on the silicon oxide layer 91, the silicon nitride layer 86, and the metal layer 82, as shown in FIG. 26.

The interconnect layer 110 and the layer stack 120 are now separated from each other by the silicon nitride layers 41 and 86, and the silicon oxide layer 91 containing impurities. As a result, even if a thermal step is performed in the subsequent steps, diffusion of hydrogen included in the layer stack 120 into the interconnect layer 110 can be suppressed. On the other hand, hydrogen included in the interconnect layer 110 is released into the air using the metal layer 82 and the insulation layer 64 as diffusion pathways. This can suppress the interconnect layer 110 from being steamed by the hydrogen included therein.

Next, although not shown in the drawing, slits are formed in the layer stack 120 by the RIE method using a mask layer. The slits penetrate the insulation layers 44 and 64 and the layer stack 120, to reach the polysilicon layer 43. Then, the sacrifice layers 71 are removed by an etching liquid or an etching gas supplied through the slits. Thereby, the gap 73 is formed between every two insulation layers 72 that are vertically adjacent to each other. The gap 73 is also formed between the insulation layer 44 and the uppermost insulation layer 72 of the layer stack 120.

Next, the conductive layers 70 are formed in the gaps 73 by, for example, the CVD method, as shown in FIG. 24. At this time, a source gas is supplied to the gaps 73 through the slits. Thereafter, an insulation layer is formed on the side surface and at the bottom of the slits, although not shown in the drawing. Thereby, the slits are filled, and the isolation section 200 shown in FIG. 1 is formed.

Furthermore, the contact Cb is formed in the insulation layer 64. The contact Cb reaches the metal layer 82 to be coupled thereto.

In this manner, the semiconductor device 100 of the third embodiment is formed.

[Advantageous Effect of Third Embodiment]

In the third embodiment, the upper part of the contact C4 is not covered with a silicon nitride layer when the contact C4 is formed. Therefore, the interconnect layer 110 is not completely covered with a silicon nitride layer. Thereby, hydrogen included in the interconnect layer 110 is released into the air using the metal layer 82 and the insulation layer 64 as diffusion pathways. Therefore, it is possible to suppress the interconnect layer 110 from being steamed by the hydrogen included therein in the thermal step in the manufacturing process. As a result, it is possible to suppress deterioration of the electrical properties of the interconnect layer 110.

On the other hand, the interconnect layer 110 and the layer stack 120 are separated from each other by the silicon nitride layers 41 and 86, and the silicon oxide layer 91 containing impurities. Thereby, even if the thermal step is performed in the subsequent steps, diffusion of hydrogen included in the layer stack 120 into the interconnect layer 110 can be inhibited.

Fourth Embodiment

A semiconductor device 100 according to the fourth embodiment will be described below with reference to FIGS. 27 to 36. The fourth embodiment is an example in which a silicon nitride layer 300 is provided in a manner to cover the perimeter of the layer stack 120. The fourth embodiment will be detailed below.

In the fourth embodiment, descriptions of the same points as the above first embodiment will be omitted, and mainly the different points will be described.

[Configuration of Fourth Embodiment]

Figure 27:
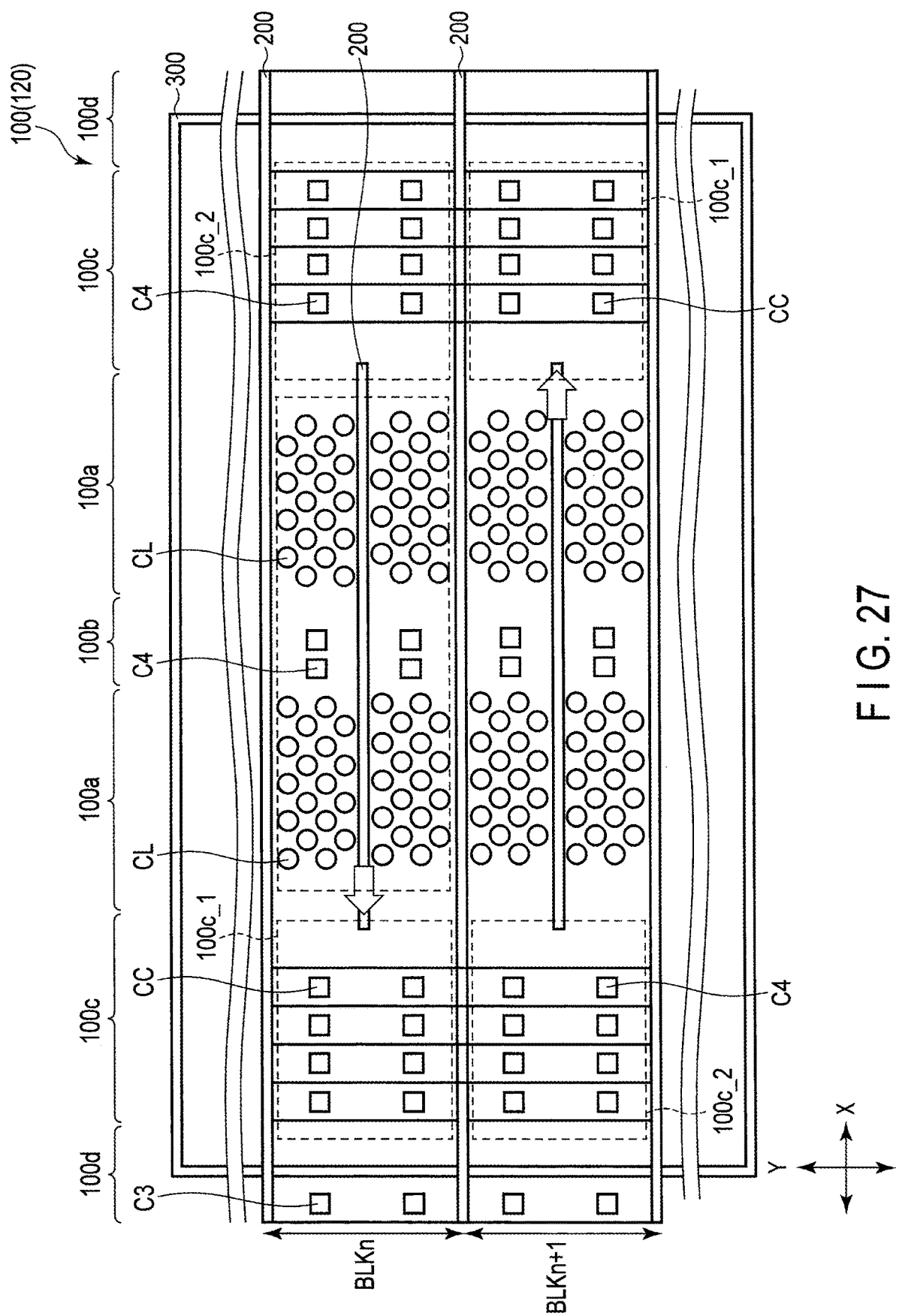
FIG. 27 is a plane view of a semiconductor device according to a fourth embodiment.

FIG. 27 is a plane view of the semiconductor device 100 according to the fourth embodiment.

The semiconductor device 100 includes the silicon nitride layer 300, as shown in FIG. 27. The silicon nitride layer 300 is provided in a manner to cover the perimeter of the memory cell array area 100a, the contact area 100b, and the staircase area 100c. Namely, the silicon nitride layer 300 includes two parts extending in the X-direction and the Z-direction, and two parts extending in the Y-direction and the Z-direction. The respective end portions of these four parts are connected to one another, thereby forming the silicon nitride layer 300 in a rectangular shape, as viewed in the Z-direction. The silicon nitride layer 300 is provided in the peripheral area 100d as viewed in the X-direction. Also, the silicon nitride layer 300 is provided closer to the inner side than the contact C3 as viewed in the X-direction.

Figure 28:
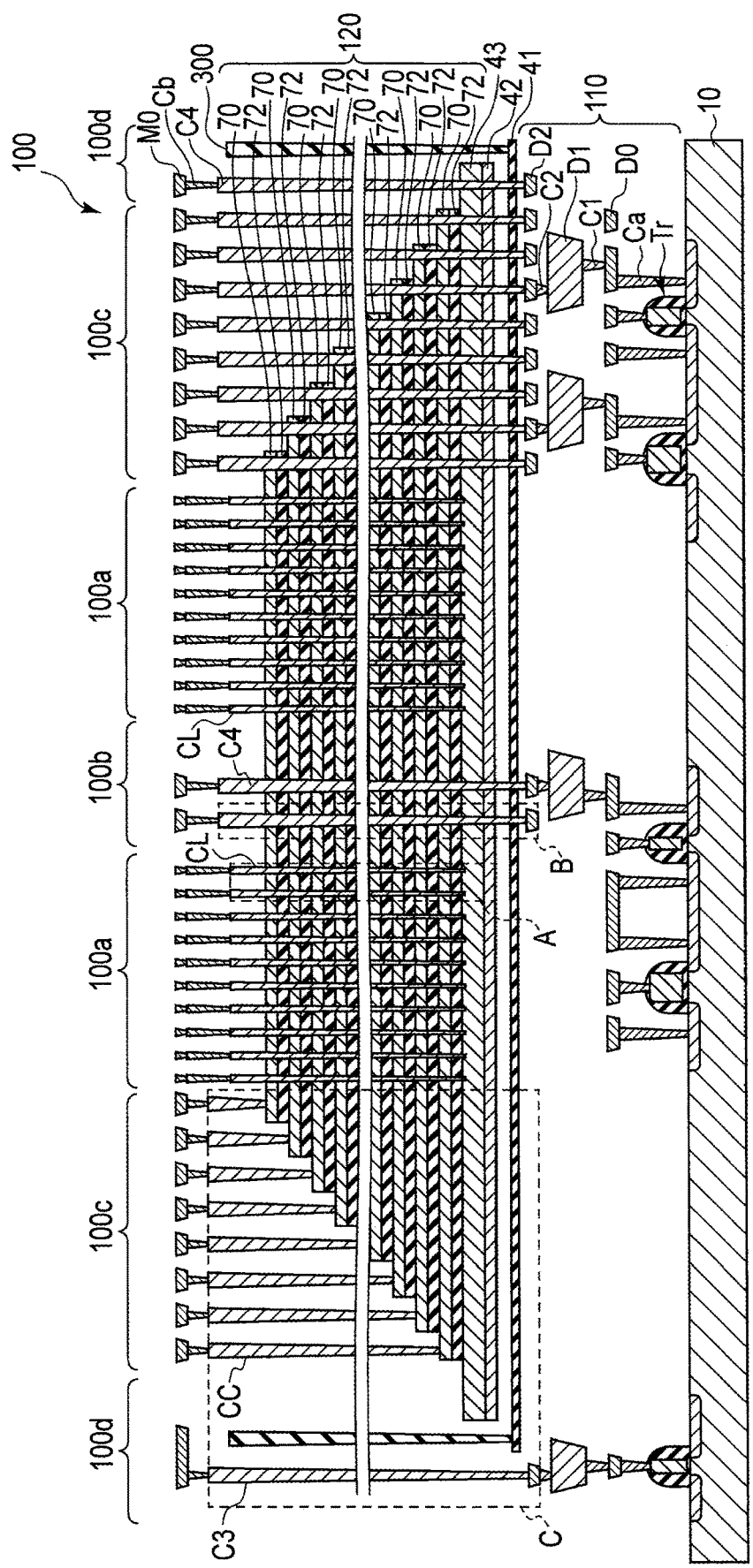
FIG. 28 is a cross-sectional view of the semiconductor device according to the fourth embodiment.

FIG. 28 is a cross-sectional view of the semiconductor device 100 according to the fourth embodiment. In FIG. 28, an interlayer insulation layer is omitted, as appropriate.

The silicon nitride layer 300 is provided around the layer stack 120, as shown in FIG. 28. The silicon nitride layer 300 includes two parts extending in the Y-direction and the Z-direction, and two parts extending in the X-direction and the Z-direction (not shown in the drawings). A lower end of the silicon nitride layer 300 is coupled to the silicon nitride layer 41. Namely, a lower side and lateral side of the layer stack 120 are surrounded by the silicon nitride layers 41 and 300. In other words, the silicon nitride layer 300 and the silicon nitride layer 41 are provided in a U-shape, as viewed in the Y-direction.

Figure 29:
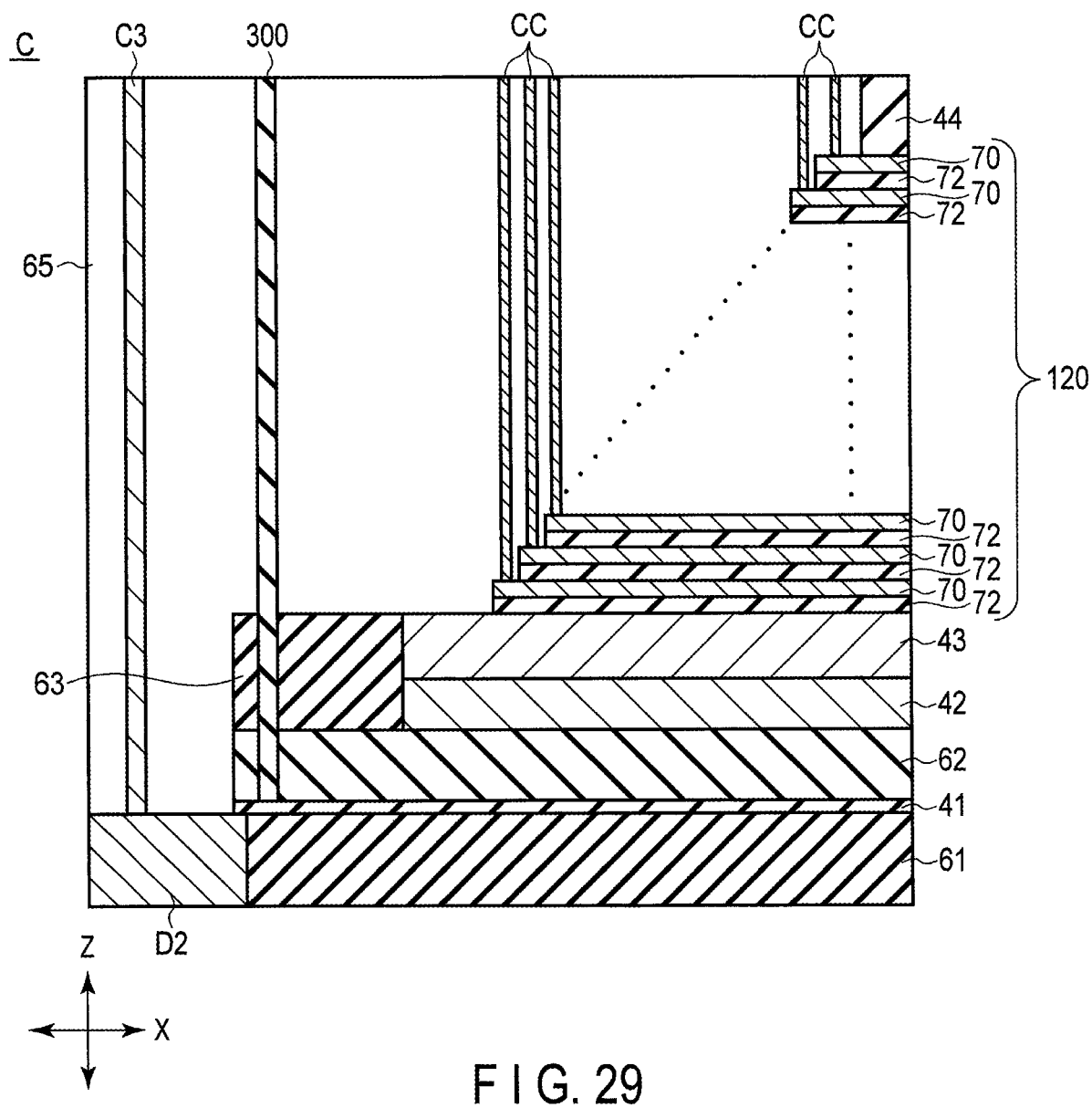
FIG. 29 is a partially enlarged cross-sectional view of the semiconductor device according to the fourth embodiment.

FIG. 29 is a partially enlarged cross-sectional view of the semiconductor device 100 according to the fourth embodiment, and is a cross-sectional view showing a part indicated by the broken line C (staircase area 100c and peripheral area 100d) in FIG. 28.

The interconnect D2 is provided in the insulation layer 61, as shown in FIG. 29. The silicon nitride layer 41 is provided on the interconnect D2 and the insulation layer 61. The insulation layer 62 is provided on the silicon nitride layer 41, and the tungsten silicide layer 42 and the polysilicon layer 43 are provided on this insulation layer 62 in the mentioned order. The insulation layer 63 is provided in a contact formation area on the same level as the tungsten silicide layer 42 and the polysilicon layer 43. The end portions of the silicon nitride layer 41 and the insulation layers 62 and 63 in the X-direction are located closer to the inner side (i.e., closer to the memory cell array area 100a) than the end portion of the interconnect D2 in the X-direction.

The layer stack 120 is formed on the polysilicon layer 43 and the insulation layer 63. The layer stack 120 includes insulation layers 72 and conductive layers 70, which are alternately stacked. One insulation layer 72 and one conductive layer 70 form a set, and a staircase (step and terrace) is formed for each set at the end portion as viewed in the X-direction. The insulation layer 44 is provided on the layer stack 120, and the insulation layer (silicon oxide layer) 65 is further provided on an entire surface thereof.

The contact CC is connected to each terrace of the layer stack 120. Also, the contact C3 is coupled to the interconnect D2. The end portions of the silicon nitride layer 41 and the insulation layers 62 and 63 as viewed in the X-direction are located closer to the inner side than the contact C3. The silicon nitride layer 300 is provided between the contact C3 and the layer stack 120. The silicon nitride layer 300 is provided in the insulation layers 62, 63, and 65 so as to extend in the Y-direction and the Z-direction. The lower end of the silicon nitride layer 300 is connected to the silicon nitride layer 41.

[Manufacturing Method of Fourth Embodiment]

FIGS. 30 to 36 are cross-sectional views showing a process of manufacturing the semiconductor device 100 according to the fourth embodiment. Hereinafter, mainly a process of manufacturing the silicon nitride layer 300 will be described.

Figure 30:
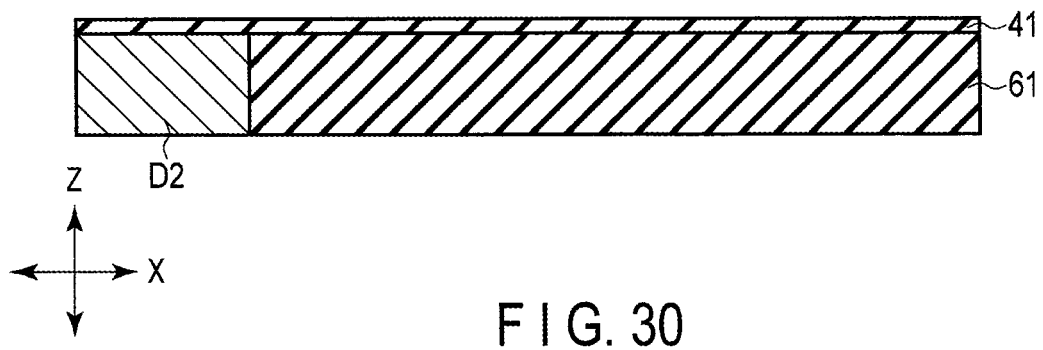

First, the interconnect D2 is formed in the insulation layer 61, as shown in FIG. 30. The insulation layer 61 is, for example, a silicon oxide layer. The interconnect D2 is formed by, for example, the damascene method. The silicon nitride layer 41 is formed on the interconnect D2 and the insulation layer 61. The silicon nitride layer 41 is formed by, for example, the LP-CVD method.

Figure 31:
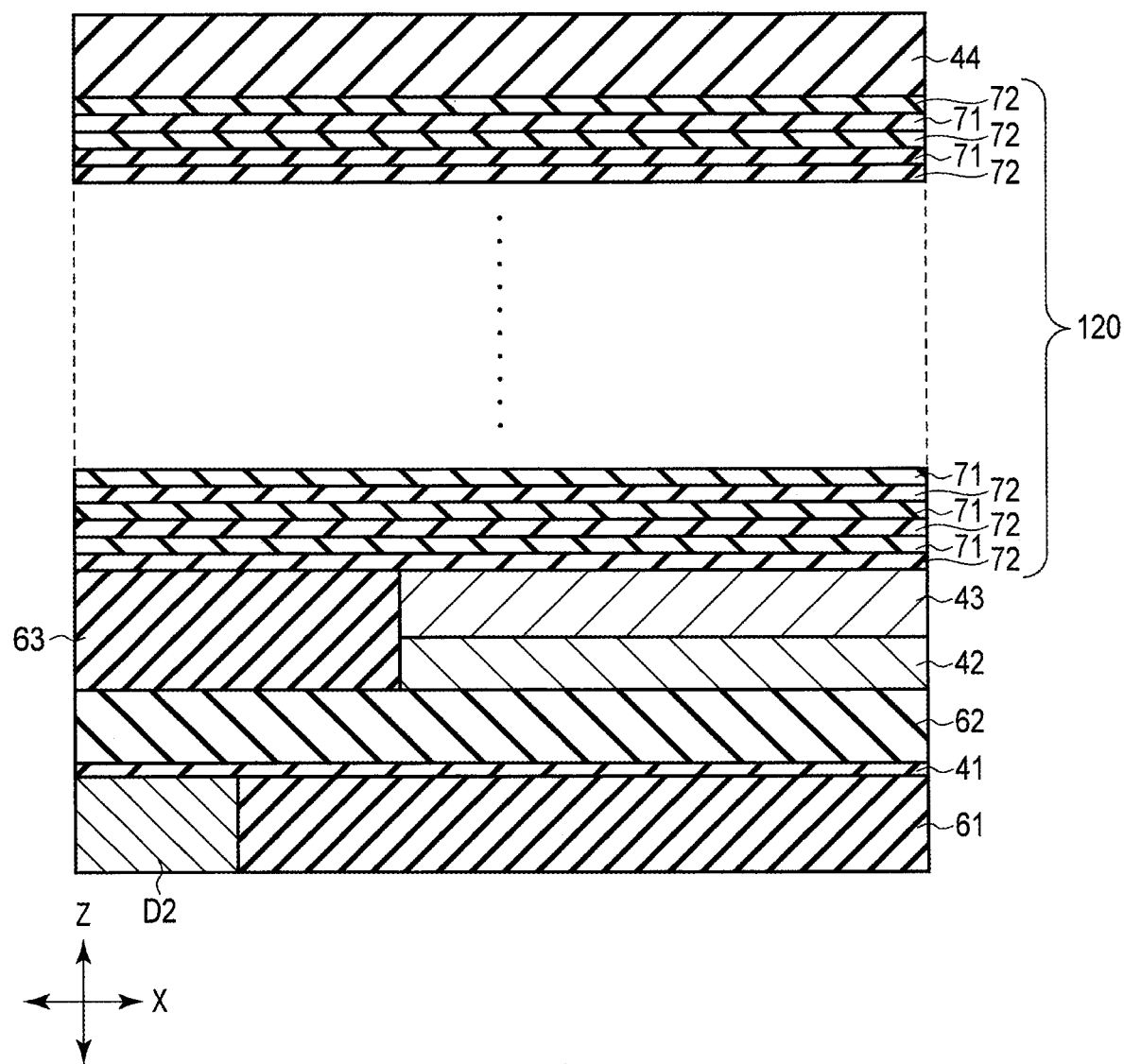

Next, the insulation layer 62 is formed on the silicon nitride layer 41, as shown in FIG. 31. The tungsten silicide layer 42 is formed on the insulation layer 62, and the polysilicon layer 43 is further formed on the tungsten silicide layer 42. The insulation layer 63 is formed in a contact formation area in the tungsten silicide layer 42 and the polysilicon layer 43.

Next, the insulation layers 72 and the sacrifice layers 71 are alternately stacked on the polysilicon layer 43 and the insulation layer 63. The step of alternately stacking the insulation layer 72 and the sacrifice layer 71 is repeated, so that the layer stack 120 that includes sacrifice layers 71 and insulation layers 72 is formed. Furthermore, the insulation layer 44 is formed on the layer stack 120. For example, the sacrifice layers 71 are silicon nitride layers, and the insulation layers 44, 62, 63, and 72 are silicon oxide layers. The sacrifice layers 71 being a silicon nitride layer are formed by, for example, the P-CVD method.

Figure 32:
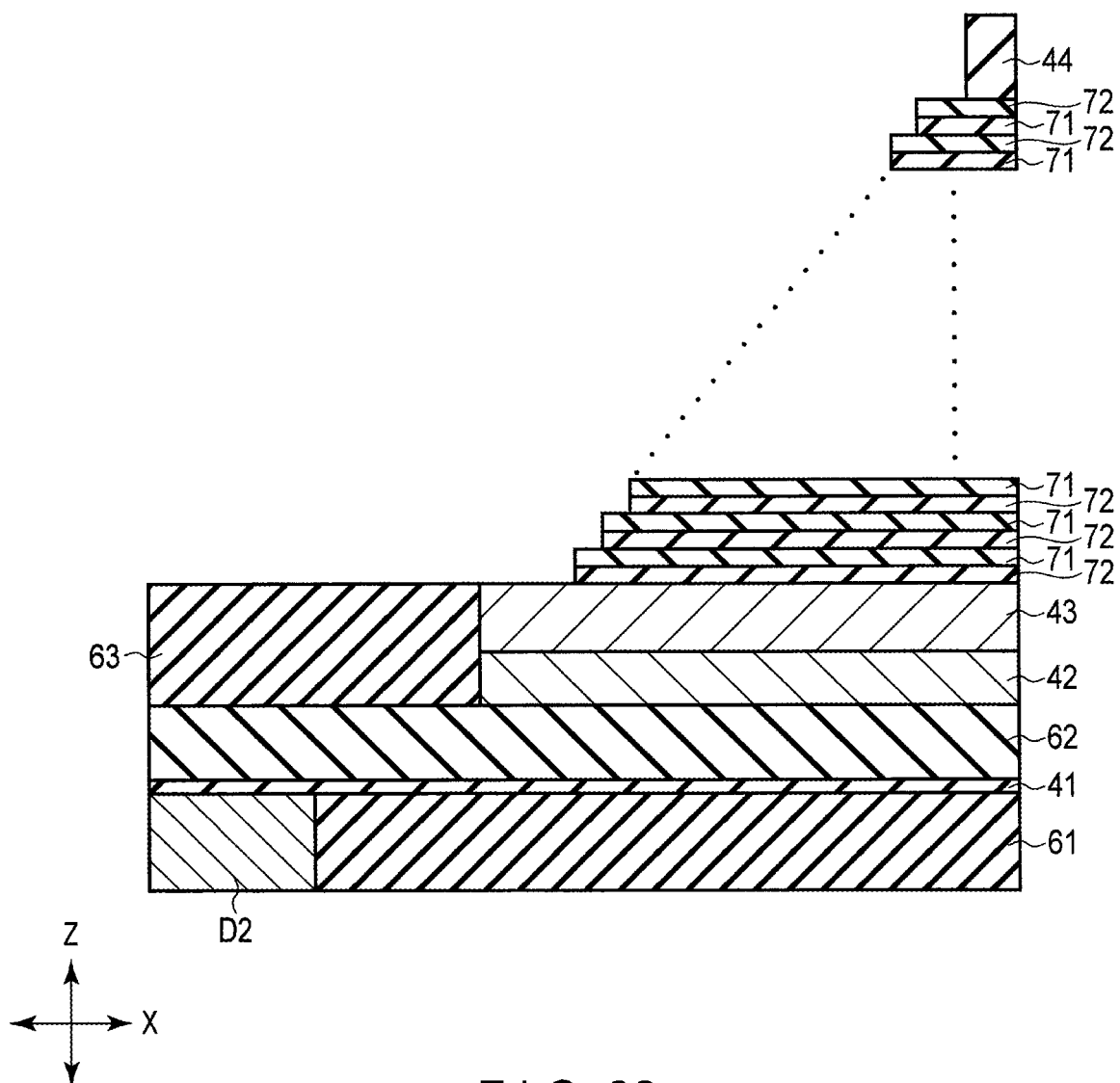

Next, as shown in FIG. 32, as one insulation layer 72 and one sacrifice layer 71 as a set, a staircase (step and terrace) is formed for each set at the end portion as viewed in the X-direction. This staircase is formed by repeating the step of slimming a resist pattern (not shown in the drawing) and the step of etching one insulation layer 72 and one sacrifice layer 71 using the resist pattern as a mask layer.

Next, the end portions of the insulation layers 62 and 63 and the silicon nitride layer 41 are removed by, for example, RIE using a mask layer not shown in the drawing, as shown in FIG. 33. Thereby, the end portions of the silicon nitride layer 41 and the insulation layers 62 and 63 as viewed in the X-direction are located closer to the inner side than the end portion of the interconnect D2 as viewed in the X-direction.

Figure 34:
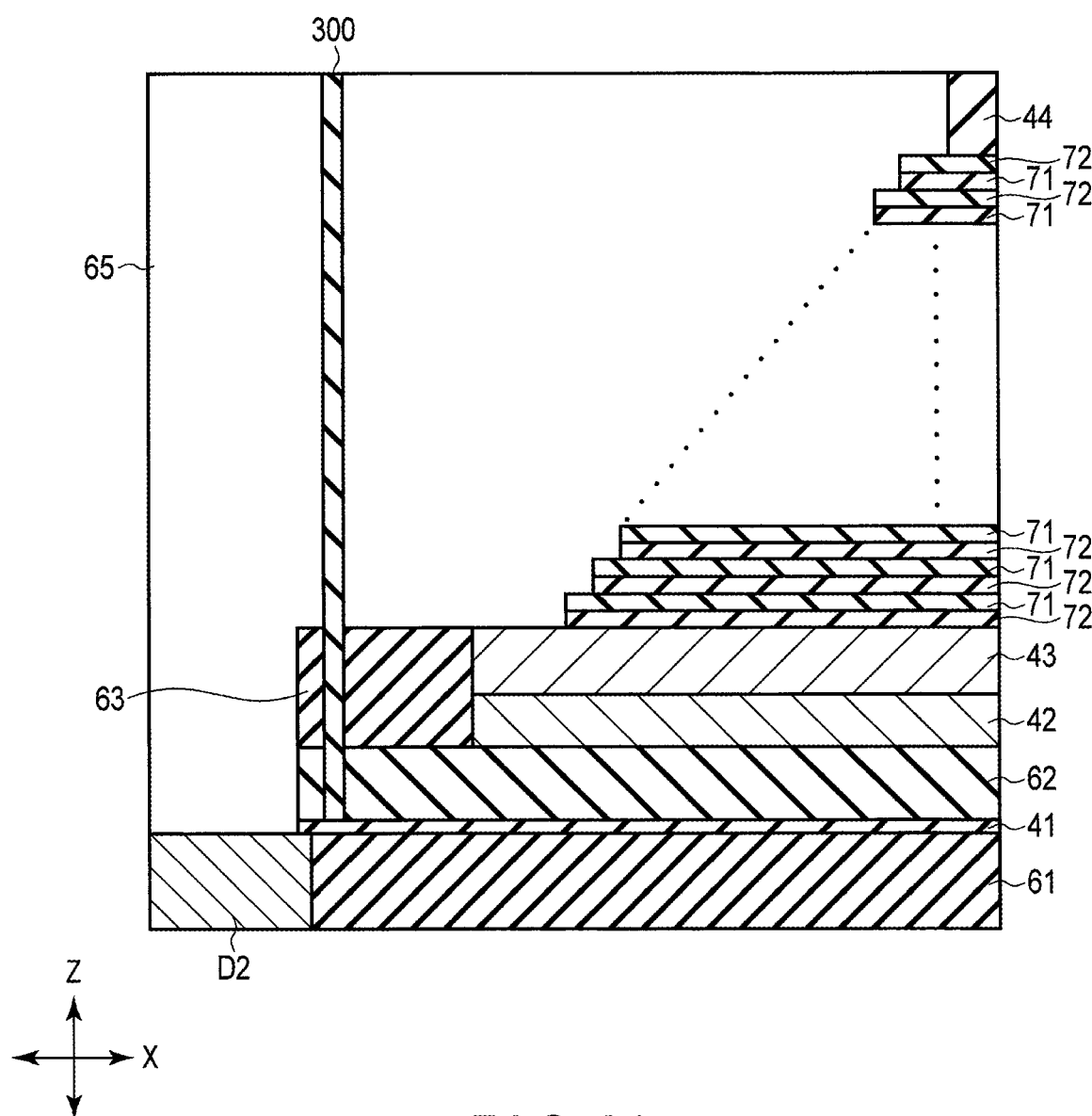

Next, the insulation layer 65 is formed on the entire surface, as shown in FIG. 34. The insulation layer 65 is, for example, a silicon oxide layer. Next, a hole not shown in the drawing is formed in the insulation layers 62, 63, and 65 so as to cover the perimeter of the layer stack 120. The hole is formed by, for example, RIE using a mask layer not shown in the drawing. The hole penetrates the insulation layers 62, 63, and 65, to reach the silicon nitride layer 41.

Thereafter, the silicon nitride layer 300 is formed in the hole. The silicon nitride layer 300 is formed by, for example, the LP-CVD method. Thereby, the hole is filled. In the end portion (peripheral area 100d), the interconnect layer 110 and the layer stack 120 are now separated from each other by the silicon nitride layers 41 and 300. As a result, even if a thermal step is performed in the subsequent steps, diffusion of hydrogen included in the layer stack 120 from the end portion side into the interconnect layer 110 can be suppressed. On the other hand, hydrogen included in the interconnect layer 110 is released into the air through the end portion side as a diffusion pathway. This can suppress the interconnect layer 110 from being steamed by the hydrogen included therein.

Next, slits are formed in the layer stack 120 by the RIE method using a mask layer, although not shown in the drawing. The slits penetrate the insulation layer 44 and the layer stack 120, to reach the polysilicon layer 43.

Then, the sacrifice layers 71 are removed by an etching liquid or an etching gas supplied through the slits, as shown in FIG. 35. For example, an etching liquid including phosphoric acid is used as the etching liquid. Thereby, the gap 73 is formed between every two insulation layers 72 that are vertically adjacent to each other. The gap 73 is also formed between the insulation layer 44 and the uppermost insulation layer 72 of the layer stack 120.

Figure 36:
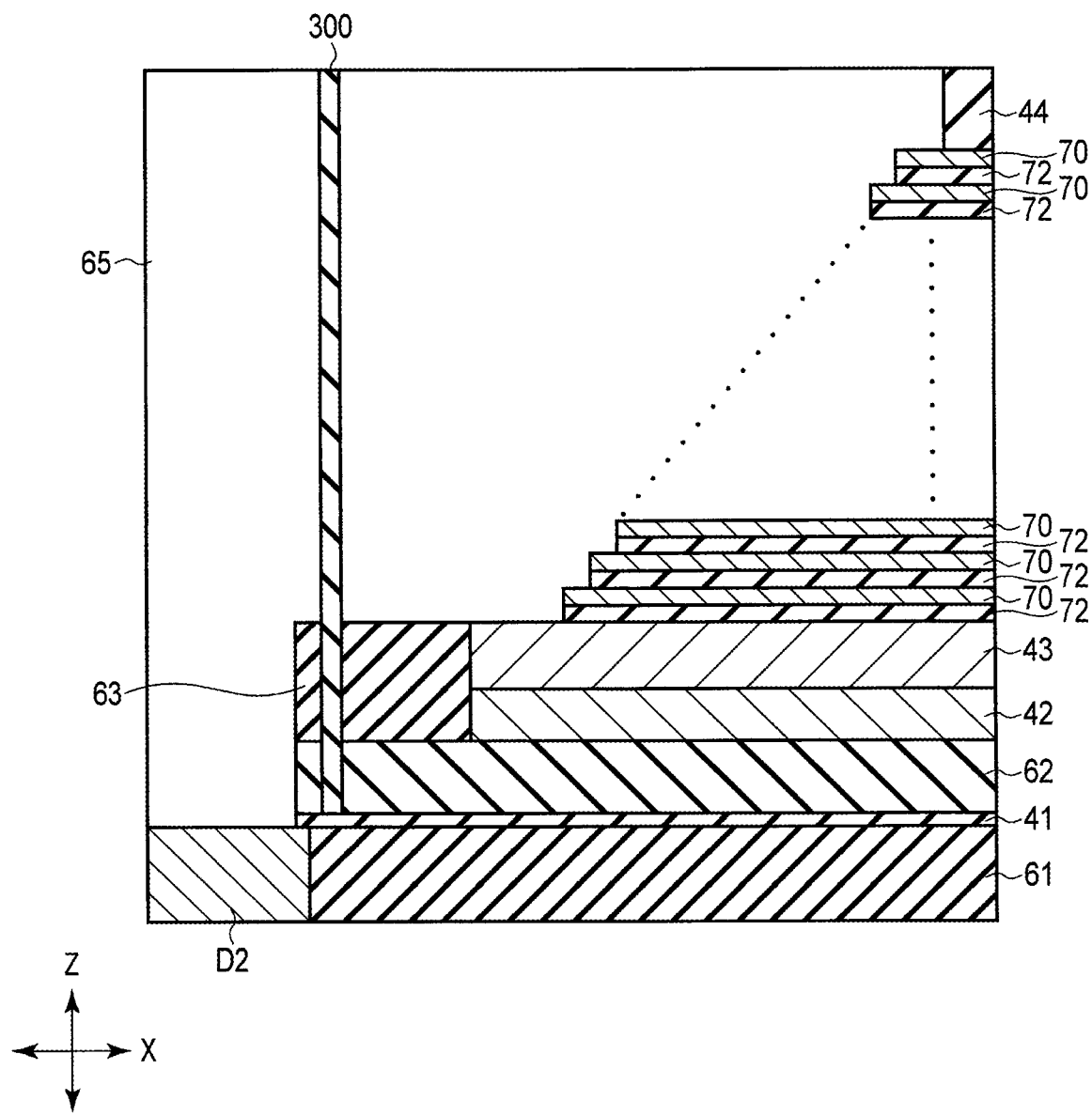

Next, the conductive layers 70 are formed in the gaps 73 by, for example, the CVD method, as shown in FIG. 36. At this time, a source gas is supplied to the gaps 73 through the slits. Thereafter, an insulation layer is formed on the side surface and at the bottom of the slits, although not shown in the drawing. Thereby, the slits are filled, and the isolation section 200 shown in FIG. 1 is formed.

Next, holes for the contacts CC and C3 are formed in the silicon oxide layer 65 by the RIE method using a mask layer, as shown in FIG. 29. The holes for the contacts CC penetrate the silicon oxide layer 65, to reach each terrace. The hole for the contact C3 penetrates the silicon oxide layer 65, to reach the interconnect D2. Thereafter, a metal layer is formed in the holes by, for example, the CVD method, and the contacts CC and C3 are formed.

In this manner, the semiconductor device 100 of the fourth embodiment is formed.

[Advantageous Effect of Fourth Embodiment]

According to the fourth embodiment described above, in the end portion (peripheral area 100d), the interconnect layer 110 and the layer stack 120 are separated from each other by the silicon nitride layers 41 and 300. Thereby, even if a thermal step is performed in the subsequent steps, diffusion of hydrogen included in the layer stack 120 from the end portion side into the interconnect layer 110 can be suppressed.

Also, according to the fourth embodiment, the end portion of the silicon nitride layer 41 is removed to such an extent that the silicon nitride layer 41 is connected to the silicon nitride layer 300. Thereby, the end portion of the interconnect layer 110 is not covered with the silicon nitride layer 41 as a barrier layer. Therefore, hydrogen included in the interconnect layer 110 is released into the air through the end portion side as a diffusion pathway. Therefore, it is possible to suppress the interconnect layer 110 from being steamed by the hydrogen included therein in the thermal step in the manufacturing process.

Also, according to the fourth embodiment, the end portion of the silicon nitride layer 41 is removed so as to be located closer to the inner side than the contact C3. Thereby, when the hole for the contact C3 is formed, it does not need to penetrate the silicon nitride layer 41. Namely, only the silicon oxide layer 65 is etched, which makes processing easy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a transistor provided on the substrate;
   a first interconnect layer provided above the transistor and electrically coupled to the transistor;
   a first conductive layer provided above the first interconnect layer;
   a layer stack provided above the first interconnect layer, the layer stack comprising a plurality of second conductive layers separated from each other;
   a pillar extending through the layer stack in a first direction and including a semiconductor layer, the first direction being a stacking direction of the second conductive layers the semiconductor layer electrically coupled to the first conductive layer, an end of the pillar being in contact with the first interconnect layers;
   a first silicon nitride layer provided between the first interconnect layer and the first conductive layer; and
   a first contact that extends in the layer stack and in the first silicon nitride layer in a stacking direction of the layer stack and is electrically coupled to the first interconnect, wherein
   the first contact comprises:
     a first metal layer continuously extending in the layer stack and in the first silicon nitride layer in the stacking direction;
     a second silicon nitride layer provided between the first metal layer and the layer stack and between the first metal layer and the first silicon nitride layer; and
     a first silicon oxide layer provided between the second silicon nitride layer and the layer stack.

2. The device according to claim 1, wherein the first contact further comprises a third silicon nitride layer provided on the first metal layer.

3. The device according to claim 1, further comprising a second silicon oxide layer provided above the layer stack and containing impurities,
   wherein:
     the first metal layer continuously extends in the second silicon oxide layer, in the layer stack, and in the first silicon nitride layer in the stacking direction, and
     the second silicon nitride layer is provided between the first metal layer and the second silicon oxide layer.

4. The device according to claim 3, wherein the impurities comprise at least one of phosphorus, carbon, arsenic, or argon.

5. The device according to claim 1, further comprising a fourth silicon nitride layer provided around the layer stack,
   wherein a lower end of the fourth silicon nitride layer is connected to the first silicon nitride layer.

* * * * *